(12) United States Patent
Hinode et al.

(10) Patent No.: US 10,580,668 B2
(45) Date of Patent: Mar. 3, 2020

(54) SUBSTRATE PROCESSING APPARATUS AND SUBSTRATE PROCESSING METHOD USING SUBSTRATE PROCESSING APPARATUS

(71) Applicant: SCREEN Holdings Co., Ltd., Kyoto (JP)

(72) Inventors: Taiki Hinode, Kyoto (JP); Takashi Ota, Kyoto (JP); Kazuhide Saito, Kyoto (JP); Kunio Yamada, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/373,228

(22) Filed: Apr. 2, 2019

(65) Prior Publication Data

US 2019/0228990 A1    Jul. 25, 2019

Related U.S. Application Data

(62) Division of application No. 14/659,716, filed on Mar. 17, 2015, now abandoned.

(30) Foreign Application Priority Data

Mar. 17, 2014 (JP) ................................. 2014-054202
Mar. 19, 2014 (JP) ................................. 2014-056080

(51) Int. Cl.
  *H01L 21/67* (2006.01)
  *H01L 21/02* (2006.01)
  *H01L 21/311* (2006.01)

(52) U.S. Cl.
  CPC .... *H01L 21/67017* (2013.01); *H01L 21/0206* (2013.01); *H01L 21/31111* (2013.01); *H01L 21/6708* (2013.01)

(58) Field of Classification Search
  None
  See application file for complete search history.

(56) References Cited

U.S. PATENT DOCUMENTS

| 5,923,356 A | 7/1999 | Gibson et al. ................. 347/131 |
| 6,001,215 A * | 12/1999 | Ban ................... H01L 21/67086 |
| | | 156/345.15 |

(Continued)

FOREIGN PATENT DOCUMENTS

| CN | 1914710 A | 2/2007 |
| CN | 101600517 A | 12/2009 |

(Continued)

OTHER PUBLICATIONS

Office Action dated Sep. 23, 2016 in the related Korean Patent Application No. 10-2015-0135446.

(Continued)

*Primary Examiner* — Allan W. Olsen
(74) *Attorney, Agent, or Firm* — Ostrolenk Faber LLP

(57) ABSTRACT

In a substrate processing apparatus, a phosphoric acid aqueous solution is supplied to a processor, and a liquid collection from the processor is concurrently performed. Further, a silicon concentration is adjusted, to supply an adjusted processing liquid to the processor. Thus, a phosphoric acid aqueous solution film is formed on the substrate. The liquid film is heated by a heating device. The heating device has lamp heaters in a casing made of a silica glass. The phosphoric acid aqueous solution on the substrate is irradiated with infrared rays. A nitrogen gas flowing in a gas passage formed in the casing is discharged towards a position outside an outer periphery of the substrate.

12 Claims, 17 Drawing Sheets

(56) References Cited

U.S. PATENT DOCUMENTS

| | | | | |
|---|---|---|---|---|
| 6,164,297 | A | 12/2000 | Kamikawa | 134/61 |
| 6,510,859 | B1 | 1/2003 | Kamikawa | 134/61 |
| 8,008,087 | B1 * | 8/2011 | Shalyt | G01N 27/4166 436/124 |
| 10,008,400 | B2 * | 6/2018 | Muraki | H01L 21/67242 |
| 10,211,063 | B2 * | 2/2019 | Hinode | H01L 21/31111 |
| 2002/0050322 | A1 | 5/2002 | Kunisawa et al. | 156/345.11 |
| 2005/0067101 | A1 | 3/2005 | Funabashi | 156/345.18 |
| 2006/0185544 | A1 | 8/2006 | Sasayama | 101/463.1 |
| 2006/0188412 | A1 | 8/2006 | Takahashi | 422/105 |
| 2006/0219273 | A1 * | 10/2006 | Nagara | B08B 3/04 134/56 R |
| 2007/0175387 | A1 | 8/2007 | Kimura | 118/429 |
| 2008/0035609 | A1 | 2/2008 | Kashkoush et al. | 216/84 |
| 2008/0066863 | A1 | 3/2008 | Kiyose et al. | 156/345.15 |
| 2008/0087645 | A1 * | 4/2008 | Izuta | C09K 13/04 216/93 |
| 2009/0017638 | A1 | 1/2009 | Yoshino et al. | 438/758 |
| 2009/0081881 | A1 | 3/2009 | Kiyose | 438/753 |
| 2009/0179008 | A1 | 7/2009 | Takahashi | 216/86 |
| 2009/0229641 | A1 | 9/2009 | Yoshida | 134/107 |
| 2010/0095981 | A1 | 4/2010 | Kamikawa | 134/3 |
| 2011/0143549 | A1 | 6/2011 | Tange et al. | 438/745 |
| 2011/0220157 | A1 | 9/2011 | Taira | 134/36 |
| 2012/0067847 | A1 | 3/2012 | Sakurai et al. | 216/83 |
| 2012/0074102 | A1 | 3/2012 | Magara et al. | 216/83 |
| 2012/0076936 | A1 | 3/2012 | Hirano | 427/248.1 |
| 2013/0220478 | A1 | 8/2013 | Kasahara et al. | 141/2 |
| 2013/0224956 | A1 | 8/2013 | Negoro et al. | 438/697 |
| 2013/0255882 | A1 | 10/2013 | Takahashi et al. | 156/345.15 |
| 2013/0306238 | A1 | 11/2013 | Miura et al. | 156/345.11 |
| 2014/0045339 | A1 | 2/2014 | Iwata et al. | 438/745 |
| 2014/0231012 | A1 | 8/2014 | Hinode et al. | 156/345.23 |
| 2014/0231013 | A1 | 8/2014 | Hinode et al. | 156/345.23 |
| 2014/0290859 | A1 * | 10/2014 | Kobayashi | H01L 21/6708 156/345.15 |
| 2014/0373882 | A1 | 12/2014 | Yoshida | |
| 2015/0020968 | A1 | 1/2015 | Kimura | 156/345.18 |
| 2015/0053285 | A1 | 2/2015 | Nakashima et al. | |
| 2015/0262811 | A1 | 9/2015 | Ogawa et al. | |
| 2015/0273538 | A1 | 10/2015 | Saiki et al. | |
| 2015/0328668 | A1 | 11/2015 | Koyama et al. | |
| 2016/0093515 | A1 | 3/2016 | Namba | 156/345.15 |

FOREIGN PATENT DOCUMENTS

| | | |
|---|---|---|
| CN | 102437050 A | 5/2012 |
| CN | 103364478 A | 10/2013 |
| CN | 103426795 A | 12/2013 |
| JP | 11-165116 A | 6/1999 |
| JP | 2002-353186 A | 12/2002 |
| JP | 2005-079212 | 3/2005 |
| JP | 2006-237228 | 9/2006 |
| JP | 2007-088257 | 4/2007 |
| JP | 2007-201329 A | 8/2007 |
| JP | 2007-258405 | 10/2007 |
| JP | 2007-273791 A | 10/2007 |
| JP | 2008-034593 A | 2/2008 |
| JP | 2008-103678 | 5/2008 |
| JP | 2009-094455 | 4/2009 |
| JP | 2009-206419 | 9/2009 |
| JP | 2009-218405 A | 9/2009 |
| JP | 2012-069696 | 4/2012 |
| JP | 2012-074601 | 4/2012 |
| JP | 2013-074252 A | 4/2013 |
| JP | 2013-128063 A | 6/2013 |
| JP | 2013-197114 | 9/2013 |
| JP | 2013-206946 | 10/2013 |
| JP | 2014-157934 | 8/2014 |
| JP | 2014-157935 | 8/2014 |
| JP | 2014-157936 | 8/2014 |
| KR | 10-2008-0011910 A | 2/2008 |

OTHER PUBLICATIONS

Chinese Office Action dated Apr. 20, 2017 in counterpart Chinese Patent Application No. 201510116914.9.

Office Action dated Aug. 7, 2018 in related Japanese Patent Application No. 2014-200695.

Office Action dated Aug. 29, 2017 issued in corresponding Japanese Patent Application No. 2014-054202.

* cited by examiner

SUBSTRATE PROCESSING APPARATUS AND SUBSTRATE PROCESSING METHOD USING SUBSTRATE PROCESSING APPARATUS

CROSS REFERENCE TO RELATED APPLICATIONS

This application is a divisional of U.S. patent application Ser. No. 14/659,716, filed Mar. 17, 2015, which claims the benefit of Japanese Patent Application Nos. 2014-054202, filed Mar. 17, 2014 and 2014-056080, filed Mar. 19, 2014, the contents of which are incorporated herein by reference.

BACKGROUND OF THE INVENTION

Field of the Invention

The present invention relates to a substrate processing apparatus that performs various processing on a substrate and a substrate processing method using the substrate processing apparatus.

Description of Related Art

Conventionally, substrate processing apparatuses have been used to subject various types of substrates such as semiconductor wafers, glass substrates for photomasks, glass substrates for liquid crystal displays, glass substrates for plasma displays, substrates for optical discs, substrates for magnetic discs, substrates for magneto-optical discs and other substrates to various types of processing.

There is a batch-type substrate processing apparatus that soaks a plurality of substrates in a processing liquid stored in a processing tank and performs processing such as etching. For example, the batch-type substrate processing apparatus described in JP 2009-94455 A includes a processing tank and a circulation line.

In the substrate processing apparatus, a phosphoric acid aqueous solution is stored in the processing tank, and a substrate on which a silicon oxide film and a silicon nitride film are formed is soaked in the phosphoric acid aqueous solution. In this state, the phosphoric acid aqueous solution overflowing from the processing tank is collected, and is supplied to the processing tank again through the circulation line.

An appropriate amount of silicon is included in the phosphoric acid aqueous solution, so that etching of the silicon oxide film by the phosphoric acid aqueous solution is inhibited. Thus, the silicon nitride film can be selectively etched.

An additive introduction mechanism and a trapping agent introduction mechanism are provided in the above-mentioned substrate processing apparatus in order to keep silicon concentration of the phosphoric acid aqueous solution within an appropriate range. The additive introduction mechanism increases the silicon concentration of the phosphoric acid aqueous solution by introducing an additive in the processing tank. Further, the trapping agent introduction mechanism inhibits an excessive increase in silicon concentration of the phosphoric acid aqueous solution by introducing a trapping agent in the processing tank.

BRIEF SUMMARY OF THE INVENTION

With recent increases in density and integration of devices, the number of steps of using single-substrate processing apparatuses instead of the batch-type substrate processing apparatuses is increased. In a single-substrate processing apparatus, it is considered that a phosphoric acid aqueous solution is supplied to a substrate on which a silicon oxide film and a silicon nitride film are formed and the phosphoric acid aqueous solution supplied to the substrate is collected to reuse the collected phosphoric acid aqueous solution via a circulation line, for example.

In the single-substrate processing apparatus, however, the phosphoric acid aqueous solution is supplied to every substrate. Therefore, it is difficult to keep silicon concentration of the phosphoric acid aqueous solution supplied to a plurality of substrates, constant. In this case, variations in etching amount of silicon nitride films occur among the plurality of substrates. In this manner, it is difficult to perform uniform processing with high accuracy on the plurality of substrates.

Therefore, it is considered that the silicon concentration is adjusted for a constant amount of phosphoric acid aqueous solution and the adjusted phosphoric acid aqueous solution is used for the processing on the plurality of substrates. In this case, because it is necessary to adjust the silicon concentration every time the constant amount of phosphoric acid aqueous solution is used, the processing of the substrate needs to be temporarily stopped. Therefore, processing efficiency of the substrates is reduced.

An object of the present invention is to provide a substrate processing apparatus in which uniform processing can be performed with high accuracy while a reduction in processing efficiency of a substrate is prevented, and a substrate processing method using the substrate processing apparatus.

Further, in a substrate processing apparatus described in JP 2013-197114 A, a substrate having a resist film is held by a substrate rotation mechanism, and an SPM (a Sulfuric acid/hydrogen peroxide mixture) is supplied to an upper surface of the substrate as a resist stripping liquid. The SPM is a liquid mixture of sulfuric acid ($H_2SO_4$) and hydrogen peroxide water ($H_2O_2$).

A lamp heater (an infrared lamp) is arranged to be opposite to the upper surface of the substrate held by the substrate rotation mechanism in order to increase reactivity between a resist and the SPM. With a liquid film of the SPM being formed on the substrate, the substrate is irradiated with infrared rays from the lamp heater. Thus, the liquid film of the SPM is heated by the lamp heater.

In the single-substrate processing apparatus using a high temperature chemical liquid, when variations in temperature of the chemical liquid on the substrate occur, uniform processing cannot be performed on the substrate. Further, when heating efficiency of the chemical liquid on the substrate is reduced, processing efficiency of the substrate by the chemical liquid is reduced.

Another object of the present invention is to provide a substrate processing apparatus in which uniform and efficient processing by a heated chemical liquid can be performed.

(1) A substrate processing apparatus according to one aspect of the present invention includes a processing unit including a processing liquid nozzle that supplies a processing liquid to a substrate, a plurality of tanks including a supply tank, a collection tank and an adjustment tank, and a path changing mechanism that includes a changeable path of the processing liquid and sets the path of the processing liquid such that a supply operation of supplying the processing liquid from the supply tank to the processing liquid nozzle, a collection operation of collecting the processing liquid from the processing unit to the collection tank, and an adjustment operation of adjusting concentration of the processing liquid stored in the adjustment tank are concurrently performed, wherein the path changing mechanism changes the path of the processing liquid such that the collection tank is changed to the adjustment tank after the collection operation is finished and changes the path of the processing liquid such that the adjusted processing liquid is supplied to the processing unit after the adjustment operation is finished.

In the substrate processing apparatus, the supply operation and the collection operation are concurrently performed. The processing liquid is supplied from the supply tank to the processing liquid nozzle by the supply operation, and the processing liquid is collected from the processing unit to the collection tank by the collection operation. Further, the concentration of the processing liquid stored in the adjustment tank is adjusted by the adjustment operation.

In this case, the processing liquid collected from the processing unit is not supplied to the adjustment tank. Therefore, the concentration of the processing liquid can be accurately adjusted in the adjustment tank. The processing liquid being adjusted in the adjustment tank is supplied to the processing unit after the adjustment operation is finished. Here, the adjusted processing liquid is supplied from the adjustment tank to the processing liquid nozzle through the supply tank, or is supplied from the adjustment tank to the processing liquid nozzle. Thus, the substrate can be processed by the processing liquid in which the concentration is accurately adjusted. Further, the collection tank is changed to the adjustment tank after the collection operation is finished. Thus, the concentration of the processing liquid collected by the collection operation can be accurately adjusted.

In this manner, it is possible to accurately adjust the concentration of the processing liquid without stopping the supply operation and the collection operation. As a result, uniform processing can be performed with high accuracy while a reduction in processing efficiency of the substrate is prevented.

(2) The path changing mechanism may change the path of the processing liquid such that the adjusted processing liquid is supplied from the adjustment tank to the supply tank after the adjustment operation is finished and changes the path of the processing liquid such that the adjustment tank is changed to the collection tank after the processing liquid is supplied to the supply tank.

In this case, the adjusted processing liquid is supplied to the supply tank after the adjustment operation is finished. Thus, the adjusted processing liquid is supplied from the adjustment tank to the processing liquid nozzle through the supply tank. Further, the adjustment tank is changed to the collection tank, and the collection tank is changed to the adjustment tank. Thus, it is possible to accurately adjust the concentration of the processing liquid without stopping the supply operation and the collection operation. Further, because the collected processing liquid is not supplied but the adjusted processing liquid is supplied to the supply tank, contamination of the supply tank is prevented and the concentration of the processing liquid in the supply tank is kept constant.

(3) The plurality of tanks may include first, second and third tanks, the first tank may be the supply tank, any one of the second and third tanks may be set as the collection tank, another one of the second and third tanks may be set as the adjustment tank, the path changing mechanism may include a first processing liquid supply system that performs the supply operation of supplying the processing liquid from the first tank to the processing liquid nozzle, a processing liquid collection system that performs the collection operation of selectively collecting the processing liquid from the processing unit to one tank of the second and third tanks, a concentration adjustment device that performs the adjustment operation of adjusting concentration of the processing liquid stored in the other tank of the second and third tanks, and a second processing liquid supply system that supplies an adjusted processing liquid from the other tank to the first tank after the adjustment operation by the concentration adjustment device is finished, the processing liquid collection system may alternately perform the collection operation from the processing unit to the second tank and the collection operation from the processing unit to the third tank, and the concentration adjustment device may alternately perform the adjustment operation in the third tank and the adjustment operation in the second tank.

In this case, the first tank is used as the supply tank. Thus, the supply operation from the first tank to the processing liquid nozzle is performed by the first processing liquid supply system. Further, the second and third tanks are alternately set as the collection tank and the adjustment tank. Thus, it is possible to accurately adjust the concentration of the processing liquid without stopping the supply operation and the collection operation.

(4) The path changing mechanism may change the path of the processing liquid such that the adjustment tank is changed to the collection tank after the adjustment operation is finished and changes the path of the processing liquid such that the supply tank is changed to the collection tank after the supply operation is finished.

In this case, the adjustment tank is changed to the supply tank after the adjustment operation is finished. Thus, the adjusted processing liquid is supplied from the supply tank after the change to the processing liquid nozzle. Further, the supply tank is changed to the collection tank after the supply operation is finished. Thus, the processing liquid is collected from the processing unit to the collection tank after the change. Further, the collection tank is changed to the adjustment tank after the collection operation is finished. Thus, the concentration of the processing liquid is adjusted in the adjustment tank after the change. In this manner, it is possible to accurately adjust the concentration of the processing liquid without stopping the supply operation and the collection operation.

(5) The plurality of tanks may include first, second and third tanks, any one of the first, second and third tanks may be set as the supply tank, another one of the first, second and third tanks may be set as the collection tank, yet another one of the first, second and third tanks may be set as the adjustment tank, the path changing mechanism may include a processing liquid supply system that performs the supply operation of supplying the processing liquid from the first, second or third tank that is set as the supply tank to the processing liquid nozzle, a processing liquid collection system that performs the collection operation of selectively collecting the processing liquid from the processing unit to the first, second or third tank that is set as the collection tank, and a concentration adjustment device that performs the adjustment operation of adjusting concentration of the processing liquid stored in the first, second or third tank that is set as the adjustment tank, the processing liquid supply system may sequentially perform the supply operation from the first tank to the processing liquid nozzle, the supply operation from the second tank to the processing liquid nozzle, and the supply operation from the third tank to the processing liquid nozzle, the processing liquid collection system may sequentially perform the collection operation from the processing unit to the second tank, the collection operation from the processing unit to the third tank, and the collection operation from the processing unit to the first tank, and the concentration adjustment device may sequentially perform the adjustment operation in the third tank, the adjustment operation in the first tank and the adjustment operation in the second tank.

In this case, each of the first, second and third tanks is sequentially used as the supply tank, the collection tank and the adjustment tank. Thus, it is possible to accurately adjust the concentration of the processing liquid without stopping the supply operation and the collection operation.

(6) The substrate may include a first film formed of a first material, and a second film formed of a second material, the processing liquid may include a component that selectively etches the first material at a higher rate than the second material, and the adjustment operation may include processing for adjusting concentration of the component in the processing liquid.

In this case, the component, which selectively etches the first material at the higher rate than the second material, is adjusted by the adjustment operation. Thus, out of the first and second films, the first film can be accurately removed and the second film can remain.

(7) The first material may include silicon nitride, and the second material may include silicon oxide, the processing liquid may be solution including silicon and phosphoric acid, and the adjustment operation may include processing for adjusting concentration of the silicon in the solution.

Silicon inhibits an etching rate of the silicon oxide. Thus, the processing liquid is supplied to the substrate, so that the first film of the first film including the silicon nitride and the second film including the silicon oxide can be selectively removed.

(8) The processing liquid nozzle may supply a chemical liquid to the substrate as the processing liquid, the processing unit may further include a substrate holding device that holds the substrate in a horizontal attitude and rotates the substrate about an axis in a vertical direction when the chemical liquid is supplied from the processing liquid nozzle to the substrate, a heating device for heating the chemical liquid supplied to the substrate by the processing liquid nozzle, and a gas supply system that supplies gas to the heating device, and the heating device may include an infrared ray generator that generates infrared rays, a first plate-shape member that is arranged between the infrared ray generator and the substrate held by the substrate holding device, and transmits infrared rays, a second plate-shape member that is arranged between the first plate-shape member and the substrate held by the substrate holding device, and transmits infrared rays, and a gas passage to which gas is supplied by the gas supply system may be formed between the first plate-shape member and the second plate-shape member, and a first discharge opening may be provided such that the gas in the gas passage is discharged towards a position further outward than an outer periphery of the substrate held by the substrate holding device.

In this case, the chemical liquid is supplied from the processing liquid nozzle to the substrate held by the substrate holding device in a horizontal attitude. Further, the infrared rays are generated by the infrared ray generator of the heating device. The infrared rays are permeated through the first and second plate-shape members, and the chemical liquid on the substrate is irradiated with the infrared rays. Thus, the chemical liquid is heated.

At this time, gas is supplied to the gas passage between the first plate-shape member and the second plate-shape member by the gas supply system. The gas flows in the gas passage and is discharged from the first discharge opening. Thus, thermal conduction from the first plate-shape member, which is heated by the heat of radiation of the infrared ray generator, to the second plate-shape member is prevented or reduced. Therefore, even when the chemical liquid on the substrate or splashes of the chemical liquid adheres or adhere to the second plate-shape member, reaction between the second plate-shape member and the chemical liquid is inhibited. Therefore, fogging is prevented from being generated in the second plate-shape member, and the chemical liquid on the substrate is uniformly irradiated with the infrared rays. Further, the gas in the gas passage is discharged from the first discharge opening towards a position further outward than the outer periphery of the substrate. Therefore, the chemical liquid on the substrate is prevented from being locally cooled by the gas. As a result, uniform and efficient processing by the heated chemical liquid becomes possible.

(9) A substrate processing method according to another aspect of the present invention is a substrate processing method using a substrate processing apparatus, wherein the substrate processing apparatus includes a processing liquid nozzle that supplies a processing liquid to a substrate, and a plurality of tanks that include a supply tank, an adjustment tank and a collection tank, and the substrate processing method includes the steps of concurrently performing a supply operation for supplying the processing liquid from the supply tank to the processing liquid nozzle, a collection operation for collecting the processing liquid from the processing unit to the collection tank, and an adjustment operation for adjusting concentration of the processing liquid stored in the adjustment tank, changing the collection tank to the adjustment tank after the collection operation is finished, and changing a path of the processing liquid such that the adjusted processing liquid is supplied to the processing unit after the adjustment operation is finished.

In the substrate processing method, the supply operation and the collection operation are concurrently performed. The processing liquid is supplied from the supply tank to the processing liquid nozzle by the supply operation, and the collection liquid is collected from the processing unit to the collection tank by the collection operation. Further, the concentration of the processing liquid stored in the adjustment tank is adjusted by the adjustment operation.

In this case, the processing liquid collected from the processing unit is not supplied to the adjustment tank. Therefore, the concentration of the processing liquid can be accurately adjusted in the adjustment tank. The processing liquid, which is adjusted in the adjustment tank, is supplied to the processing unit after the adjustment operation is finished. Here, the adjusted processing liquid is supplied from the adjustment tank to the processing liquid nozzle through the supply tank, or is supplied from the adjustment tank to the processing liquid nozzle. Thus, the substrate can be processed by the processing liquid in which the concentration is accurately adjusted. Further, the collection tank is changed to the adjustment tank after the collection operation is finished. Thus, the concentration of the processing liquid, which is collected by the collection operation, can be accurately adjusted.

In this manner, it is possible to accurately adjust the concentration of the processing liquid without stopping the supply operation and the collection operation. As a result, it is possible to perform uniform processing with high accuracy while a reduction in processing efficiency of the substrate is prevented.

(10) A substrate processing apparatus according to yet another aspect of the present invention includes a substrate holding device that holds a substrate in a horizontal attitude and rotates the substrate about an axis in a vertical direction, a chemical liquid supply system that supplies a chemical liquid to the substrate held by the substrate holding device, a heating device for heating the chemical liquid supplied to the substrate by the chemical liquid supply system, and a gas supply system that supplies gas to the heating device, wherein the heating device includes an infrared ray generator that generates infrared rays, a first plate-shape member that is arranged between the infrared ray generator and the substrate held by the substrate holding device, and transmits infrared rays, a second plate-shape member that is arranged between the first plate-shape member and the substrate held by the substrate holding device, and transmits infrared rays, and a gas passage to which gas is supplied by the gas supply system is formed between the first plate-shape member and the second frame-shape member, and a first discharge opening is provided such that the gas in the gas passage is discharged towards a position further outward than an outer periphery of the substrate held by the substrate holding device.

In this substrate processing apparatus, the chemical liquid is supplied by the chemical supply system to the substrate held by the substrate holding device in a horizontal attitude. Further, the infrared rays are generated by the infrared ray generator of the heating device. The infrared rays are permeated through the first and second plate-shape members, and the chemical liquid on the substrate is irradiated with the infrared rays. Thus, the chemical liquid is heated.

At this time, gas is supplied to the gas passage between the first plate-shape member and the second plate-shape member by the gas supply system. The gas flows in the gas passage, and is discharged from the first discharge opening. Thus, thermal conduction from the first plate-shape member, which is heated by the heat of radiation of the infrared ray generator, to the second plate-shape member is prevented or reduced. Therefore, even when the chemical liquid on the substrate or splashes of the chemical liquid adheres or adhere to the second plate-shape member, reaction between the second plate-shape member and the chemical liquid is inhibited. Therefore, fogging is prevented from being generated in the second plate-shape member, and the chemical liquid on the substrate is uniformly irradiated with the infrared rays. Further, the gas in the gas passage is discharged from the first discharge opening to a position further outward than the outer periphery of the substrate. Therefore, the chemical liquid on the substrate is prevented from locally being cooled by the gas. As a result, uniform and efficient processing by the heated chemical liquid becomes possible.

(11) The first discharge opening may discharge the gas in the gas passage outward of the substrate from a position further outward than the outer periphery of the substrate in an outward radial direction of the substrate.

In this case, because the gas being discharged from the first discharge opening is directed from a position further outward than the outer periphery of the substrate to a position even further outward than the position in a radial direction of the substrate, the gas is prevented from flowing on the liquid film of the chemical liquid supplied to the substrate. Therefore, a reduction in temperature of the chemical liquid, which is caused when the gas flows on the liquid film of the chemical liquid supplied to the substrate, is prevented.

(12) The infrared ray generator may be provided such that a region from a center to the outer periphery in a radial direction of the substrate held by the substrate holding device is irradiated with infrared rays with the heating device being still above the substrate held by the substrate holding device.

In this case, because the region from the center to the outer periphery in the radial direction of the substrate is simultaneously irradiated with the infrared rays, the entire chemical liquid on the substrate is more uniformly heated by the rotation of the substrate.

(13) The infrared ray generator may be formed in a circular arc shape to extend along the outer periphery of the substrate held by the substrate holding device.

In this case, the chemical liquid on the substrate is uniformly irradiated with the infrared rays in a circumferential direction of the substrate. Thus, the chemical liquid on the substrate is more uniformly heated in the circumferential direction.

(14) The plurality of infrared ray generators may be provided to be arranged in a direction from a center portion towards the outer periphery of the substrate held by the substrate holding device.

In this case, the chemical liquid on the substrate can be efficiently heated in a region in the radial direction of the substrate.

(15) The substrate processing apparatus may further include a casing that stores the infrared ray generator, wherein the casing may have a bottom portion and have first, second, third and fourth sidewall portions, the first plate-shape member and the second plate-shape member may constitute the bottom portion of the casing, the fourth sidewall portion may be provided to be located above the outer periphery of the substrate held by the substrate holding device, the first sidewall portion may be provided to be opposite to the fourth sidewall portion, and the second and third sidewall portions may be provided to respectively connect both ends of the first side portion to both ends of the fourth sidewall portions, the first sidewall portion may be constituted by a plate-shape first inner member that transmits infrared rays, and a plate-shape first outer member that is located outside of the first inner member and transmits infrared rays, a first side passage that communicates with the gas passage may be formed between the first inner member and the first outer member, the second sidewall portion may be constituted by a plate-shape second inner member that transmits infrared rays, and a plate-shape second outer member that is located outside of the second inner member and transmits infrared rays, a second side passage that communicates with the gas passage may be formed, and a second discharge opening that discharges gas in the second side passage to a position further outward than the outer periphery of the substrate held by the substrate holding device may be provided, between the second inner member and the second outer member, the third sidewall portion may be constituted by a plate-shape third inner member that transmits infrared rays, and a plate-shape third outer member that is located outside of the third outer member and transmits infrared rays, a third side passage that communicates with the gas passage may be formed, and a third discharge opening that discharges gas in the third side passage to a position further outward than the outer periphery of the substrate held by the substrate holding device may be provided, between the third inner member and the third outer member.

In this case, the infrared rays being generated by the infrared ray generator is permeated through the first inner member and the first outer member of the first sidewall portion, and the chemical liquid on the substrate is irradiated with the infrared rays. Further, the infrared rays are permeated through the second inner member and the second outer member of the second sidewall portion, and the chemical liquid on the substrate is irradiated with the infrared rays. Further, the infrared rays are permeated through the third inner member and the third outer member of the third sidewall portion, and the chemical liquid on the substrate is irradiated with the infrared rays. Thus, heating efficiency of the chemical liquid is improved.

At this time, gas is supplied to the first, second and third side passages. The gas flows in the first, second and third side passages, and is discharged from the second and third discharge openings. Thus, thermal conduction from the first, second and third inner members, which is heated by the heat of radiation of the infrared ray generator, to the first, second and third outer members is prevented or reduced. Therefore, even when the chemical liquid on the substrate or splashes of the chemical liquid adheres or adhere to the first, second or third outer member, reaction between the first, second or third outer member and the chemical liquid is inhibited. Therefore, fogging is prevented from being generated in the first, second or third outer member, and the chemical liquid on the substrate is uniformly irradiated with the infrared rays. Further, the gas in the second and third side passages is discharged from the respective second and third discharge openings to positions further outward than the outer periphery of the substrate. Therefore, the chemical liquid on the substrate is prevented from being cooled by the gas. As a result, uniform and efficient processing of the substrate by the heated chemical liquid becomes possible.

(16) The second and third sidewall members may be provided to extend in a substantially radial direction of the substrate held by the substrate holding device.

In this case, the chemical liquid on the substrate can be uniformly heated, and the size and weight of the heating device can be reduced.

(17) The first and second plate-shape members may be formed of glass.

In this case, because the first and second plate-shape members have high transmittance with respect to the infrared rays, the chemical liquid on the substrate can be efficiently heated.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus and a substrate processing method using the substrate processing apparatus according to one embodiment of the present invention will be described below with reference to drawings. In the following description, a substrate refers to a semiconductor wafer, a glass substrate for a liquid crystal display, a glass substrate for a PDP (Plasma Display Panel), a glass substrate for a photo-mask, a substrate for an optical disc, or the like.

[1] First Embodiment

A substrate processing apparatus according to the present embodiment is a single-substrate processing apparatus that processes substrates one by one. In the substrate processing apparatus, a high temperature phosphoric acid aqueous solution ($H_3PO_4+H_2O$) including silicon is supplied as a processing liquid to a substrate on which a silicone oxide film made of silicon oxide ($SiO_2$) and a silicon nitride film made of silicon nitride ($Si_3N_4$) are formed. In this case, the phosphoric acid aqueous solution includes silicon, so that an etching rate of the silicone oxide film is reduced. Thus, the silicon nitride film is selectively etched.

Silicon is present in the phosphoric acid aqueous solution because the silicon nitride film is etched by the phosphoric acid aqueous solution or a liquid concentrate including silicon particles is mixed in the phosphoric acid aqueous solution, for example.

(1) Configuration of Substrate Processing Apparatus

Figure 1:
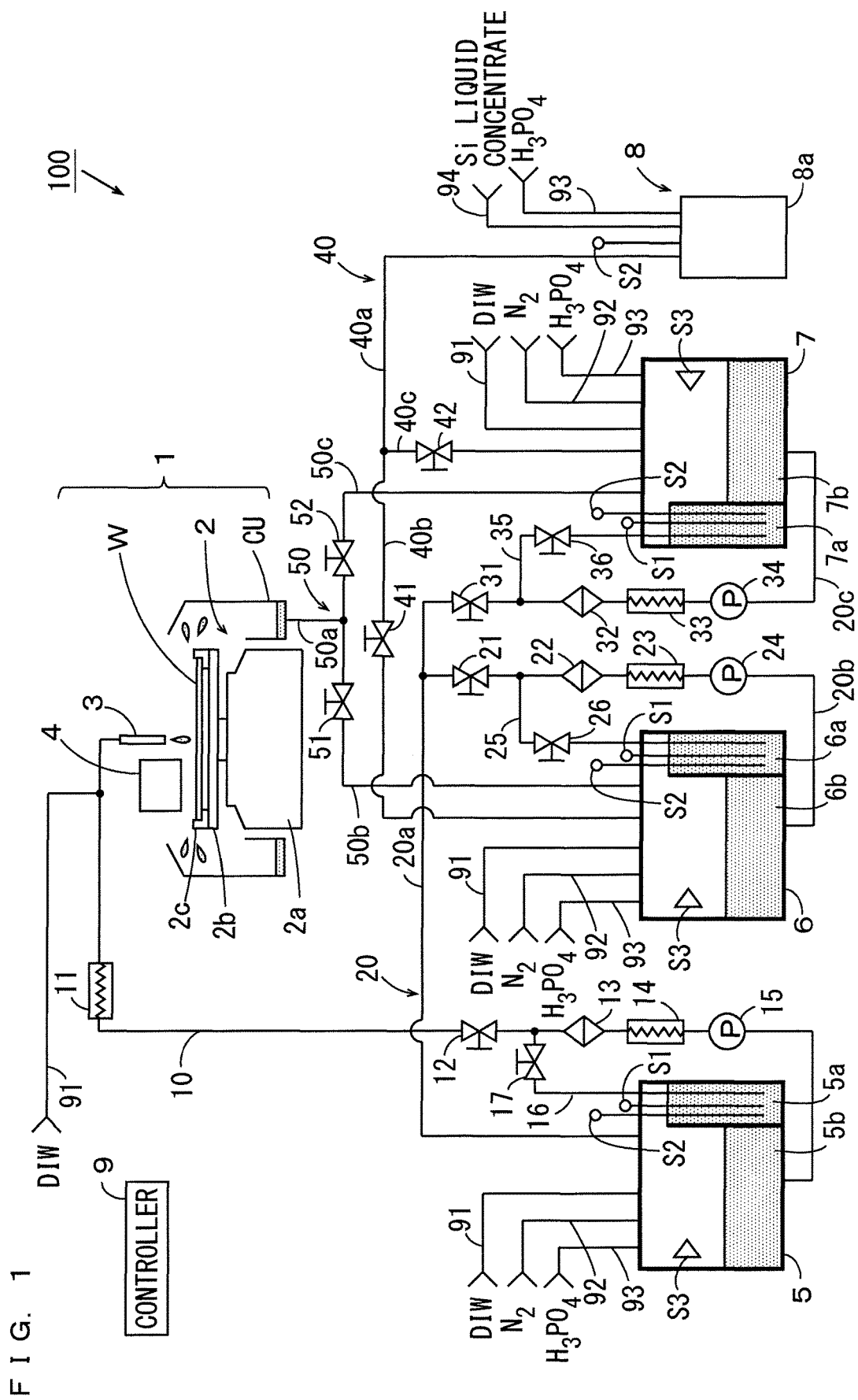
FIG. 1 is a schematic view showing the configuration of a substrate processing apparatus according to a first embodiment.

FIG. 1 is a schematic view showing the configuration of the substrate processing apparatus according to the first embodiment. As shown in FIG. 1, the substrate processing apparatus 100 mainly includes a processor 1, a first tank 5, a second tank 6, a third tank 7, a new liquid supply device 8 and a controller 9. Further, the processor 1 includes a spin chuck 2, a processing liquid nozzle 3, a heating device 4 and a cup CU. In the processor 1, the plurality of substrates W are sequentially processed one by one.

The spin chuck 2 has a spin motor 2a, a spin base 2b and a plurality of chuck pins 2c. The spin motor 2a is provided such that a rotation shaft is parallel to a vertical direction. The spin base 2a has a disc shape and is attached to an upper end of the rotation shaft of the spin motor 2a in a horizontal attitude. The plurality of chuck pins 2c are provided on an upper surface of the spin base 2b, and hold a peripheral edge of the substrate W. With the plurality of chuck pins 2c holding the substrate W, the spin motor 2a is operated. Thus, the substrate W is rotated about a vertical axis.

While the mechanical spin chuck 2 holding the peripheral edge of the substrate W is used in the present example as described above, the invention is not limited to this. A suction-type spin chuck, which holds a lower surface of the substrate W by suction, may be used instead of the mechanical spin chuck.

The processing liquid nozzle 3 and the heating device 4 are provided to be movable between a position above the substrate W held by the spin chuck 2 and a waiting position beside the substrate W. The processing liquid nozzle 3 supplies the phosphoric acid aqueous solution supplied from the first tank 5 to the substrate W rotated by the spin chuck 2.

When the phosphoric acid aqueous solution is supplied from the processing liquid nozzle 3 to the substrate W, the heating device 4 is arranged at a position opposite to an upper surface of the substrate W. The heating device 4 includes a lamp heater that generates infrared rays, and heats the substrate W and the processing liquid supplied to the substrate W by heat of radiation. For example, a tungsten-halogen lamp, a xenon arc lamp, a graphite heater or the like can be used as the lamp heater.

A heating temperature of the substrate W by the heating device 4 is set higher than a boiling point corresponding to phosphoric acid concentration of the phosphoric acid aqueous solution (not less than 140° C. and not more than 160° C., for example). Thus, a temperature of the phosphoric acid aqueous solution on the substrate W is increased to the boiling point corresponding to the phosphoric acid concentration, and an etching rate of the silicon nitride film by the phosphoric acid aqueous solution is increased.

On the other hand, when silicon concentration in the phosphoric acid aqueous solution is within an appropriate range, an etching rate of the silicone oxide film by the phosphoric acid aqueous solution is kept sufficiently lower than an etching rate of the silicon nitride film. As a result, the silicon nitride film on the substrate W is selectively etched as described above.

The cup CU is provided to surround the spin chuck 2. The cup CU is lowered at a time of carrying of the substrate W into the spin chuck 2 and a time of carrying of the substrate W out from the spin chuck 2, and is lifted at a time of supply of the phosphoric acid aqueous solution to the substrate W.

At the time of supply of the phosphoric acid aqueous solution to the rotating substrate W, an upper end of the cup CU is located at a position further upward than the substrate W. Thus, the phosphoric acid aqueous solution being shaken off from the substrate W is caught by the cup CU. The phosphoric acid aqueous solution being caught by the cup CU is sent to the second tank 6 or the third tank 7 as described below.

The first tank 5 includes a circulation tank 5a and a storage tank 5b. The circulation tank 5a and the storage tank 5b are arranged to be adjacent to each other, and are configured such that an overflowing liquid from one tank (the circulation tank 5a, for example) flows into the other tank (the storage tank 5b, for example). A phosphoric acid concentration meter S1 and a silicon concentration meter S2 are provided in the circulation tank 5a. The phosphoric acid concentration meter S1 outputs the phosphoric acid concentration of the phosphoric acid aqueous solution, and the silicon concentration meter S2 outputs the silicon concentration of the phosphoric acid aqueous solution. A liquid surface sensor S3, which outputs a height of a liquid surface of the phosphoric acid aqueous solution, is provided in the storage tank 5b. A DIW (Deionized Water) supply system 91, a nitrogen ($N_2$) gas supply system 92 and a phosphoric acid aqueous solution supply system 93 are connected to the storage tank 5b.

A first supply pipe 10 is provided to connect the storage tank 5b of the first tank 5 to the processing liquid nozzle 3 of the processor 1. A pump 15, a heater 14, a filter 13, a valve 12 and a heater 11 are inserted into the first supply pipe 10 in this order from the storage tank 5b towards the processing liquid nozzle 3.

A circulation pipe 16 is provided to connect a portion, of the first supply pipe 10, that is located between the filter 13 and the valve 12 to the circulation tank 5a. A valve 17 is inserted into the circulation pipe 16. Further, the DIW supply system 91 is connected to a portion, of the first supply pipe 10, that is located between the heater 11 and the processing liquid nozzle 3.

Each of the second and third tanks 6, 7 has the same configuration as the first tank 5, and includes each of circulation tanks 6a, 7a and each of storage tanks 6b, 7b. A phosphoric acid concentration meter S1 and a silicon concentration meter S2 are provided in each of the circulation tanks 6a, 7a. A liquid surface sensor S3 is provided in each of the storage tanks 6b, 7b, and a DIW supply system 91, a nitrogen gas supply system 92 and a phosphoric acid aqueous solution supply system 93 are connected to each of the storage tanks 6b, 7b.

A second supply pipe 20 is provided to connect the storage tank 5b of the first tank 5 to each of the storage tanks 6b, 7b of each of the second and third tanks 6, 7. The second supply pipe 20 has one main pipe 20a and two branch pipes 20b, 20c. The branch pipes 20b, 20c are connected to the main pipe 20a. The main pipe 20a is connected to the storage tank 5b of the first tank 5, and the two branch pipes 20b, 20c are respectively connected to the storage tanks 6b, 7b of the respective second and third tanks 6, 7.

A pump 24, a filter 23, a heater 22 and a valve 21 are inserted into the one branch pipe 20b in this order from the storage tank 6b towards the main pipe 20a. A circulation pipe 25 is provided to connect a portion, of the branch pipe 20*b*, that is located between the filter 22 and the valve 21 to the circulation tank 6*a*. A valve 26 is inserted into the circulation pipe 25.

A pump 34, a heater 33, a filter 32 and a valve 31 are inserted into the other branch pipe 20*c* in this order from the storage tank 7*b* towards the main pipe 20*a*. A circulation pipe 35 is provided to connect a portion, of the branch pipe 20*c*, that is located between the filter 32 and the valve 31 to the circulation tank 7*a*. A valve 36 is inserted into the circulation pipe 35.

A collection pipe 50 is provided to connect the cup CU of the processor 1 to each of the storage tanks 6*b*, 7*b* of each of the second and third tanks 6, 7. The collection pipe 50 has one main pipe 50*a* and two branch pipes 50*b*, 50*c*. The branch pipes 50*b*, 50*c* are connected to the main pipe 50*a*. The main pipe 50*a* of the collection pipe 50 is connected to the cup CU, and the two branch pipes 50*b*, 50*c* are respectively connected to the storage tanks 6*b*, 7*b* of the respective second and third tanks 6, 7. A valve 51 is inserted into the branch pipe 50*b*, and a valve 52 is inserted into the branch pipe 50*c*.

The new liquid supply device 8 has a mixing tank 8*a* and a supply device that supplies liquid in the mixing tank 8*a* to the outside. A phosphoric acid aqueous solution supply system 93 and a silicon (Si) liquid concentrate supply system 94 are connected to the new liquid supply device 8. Further, a silicon concentration meter S2 is provided in the mixing tank 8*a*.

In the mixing tank 8*a* of the new liquid supply device 8, a phosphoric acid aqueous solution and a silicon liquid concentrate, which are respectively supplied from the phosphoric acid aqueous solution supply system 93 and the silicon liquid concentrate supply system 94, are mixed at a predetermined ratio in advance. Thus, a phosphoric acid aqueous solution having predetermined silicon concentration (hereinafter referred to as reference silicon concentration) is produced as a new processing liquid, and is kept at a predetermined temperature. In the present example, liquid in which silicon particles are dissolved in the phosphoric acid aqueous solution is used as the silicon liquid concentrate.

Further, in the new liquid supply device 8, silicon concentration in the mixing tank 8*a* can be adjusted to a value different from the reference silicon concentration. For example, with the phosphoric acid aqueous solution having the reference silicon concentration being stored in the mixing tank 8*a*, the silicon liquid concentrate is added in the mixing tank 8*a*. Thus, the silicon concentration in the mixing tank 8*a* can be made higher than the reference silicon concentration. Further, with the phosphoric acid aqueous solution having the reference silicon concentration being stored in the mixing tank 8*a*, a phosphoric acid aqueous solution is added in the mixing tank 8*a*. Thus, the silicon concentration in the mixing tank 8*a* can be made lower than the reference silicon concentration.

A third supply pipe 40 is provided to connect the new liquid supply device 8 to each of the storage tanks 6*b*, 7*b* of each of the second and third tanks 6, 7. The third supply pipe 40 has one main pipe 40*a* and two branch pipes 40*b*, 40*c*. The branch pipes 40*b*, 40*c* are connected to the main pipe 40*a*. The main pipe 40*a* of the third supply pipe 40 is connected to the new liquid supply device 8, and the two branch pipes 40*b*, 40*c* are respectively connected to the storage tanks 6*b*, 7*b* of the respective second and third tanks 6, 7. A valve 41 is inserted into the branch pipe 40*b*, and a valve 42 is inserted into the branch pipe 40*c*.

The controller 9 is constituted by a CPU (Central Processing Unit) and a memory, a microcomputer or the like. A system program is stored in the memory of the controller 9. The controller 9 controls the operation of each constituent element of the substrate processing apparatus 100.

For example, the controller 9 switches between an open state and a close state of each valve 12, 17, 21, 26, 31, 36, 41, 42, 51, 52 based on a height of the liquid surface that is output from each liquid surface sensor S3. Further, the controller 9 controls each DIW supply system 91, each nitrogen gas supply system 92 and each phosphoric acid aqueous solution supply system 93 based on phosphoric acid concentration that is output from each phosphoric acid concentration meter S1. Further, the controller 9 controls the new liquid supply device 8, each phosphoric acid aqueous solution supply system 93 and each silicon liquid concentrate supply system 94 based on silicon concentration that is output from each silicon concentration meter S2.

(2) Operation of Substrate Processing Apparatus

Figure 2:
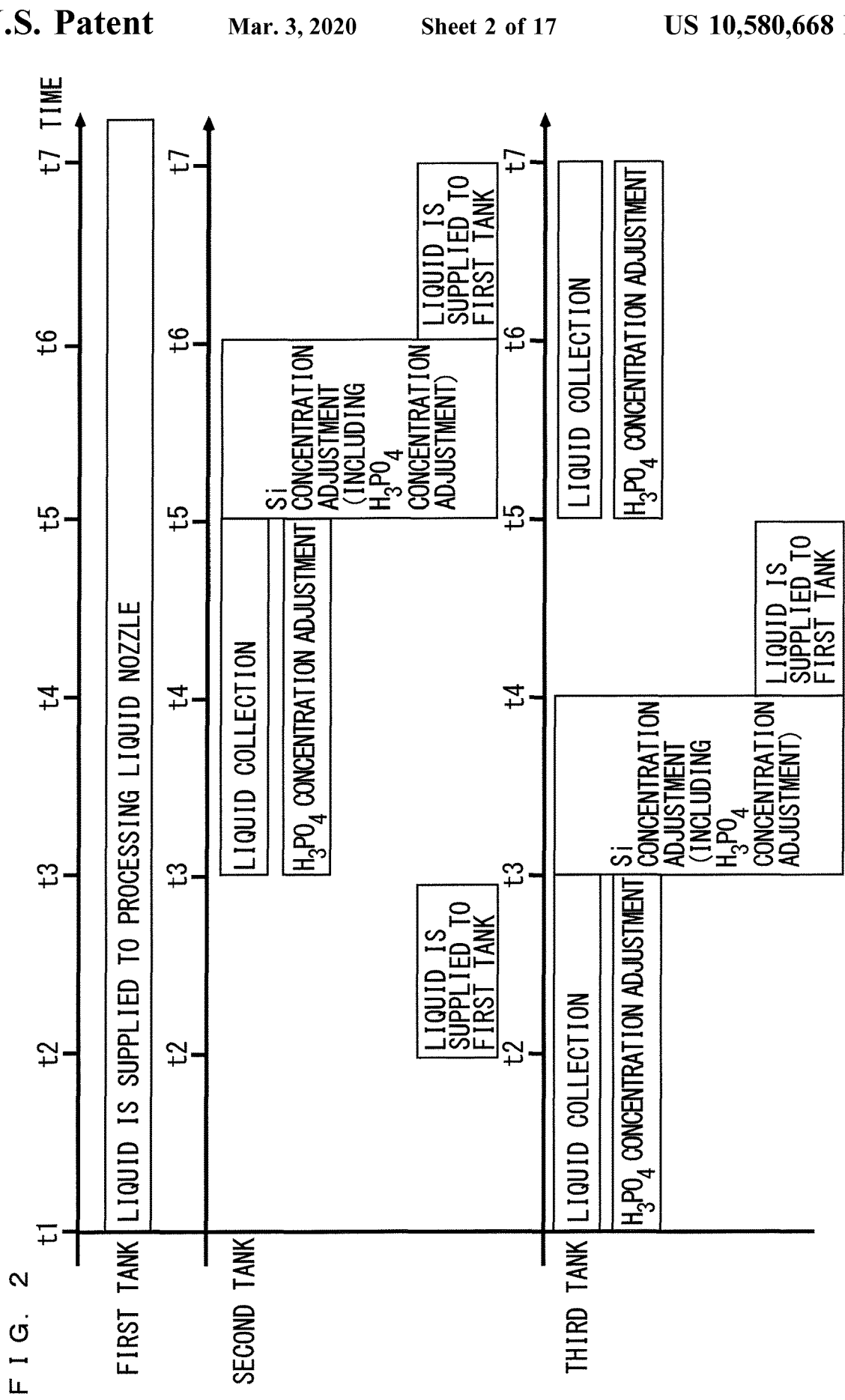
FIG. 2 is a time chart showing contents of operations respectively related to first, second and third tanks of FIG. 1.

A series of operations of the substrate processing apparatus 100 performed when the plurality of substrates W are processed by the processor 1 will be described. FIG. 2 is a time chart showing the contents of operations respectively related to the first, second and third tanks 5, 6, 7 of FIG. 1. FIGS. 3 to 7 are schematic views showing the operations of the substrate processing apparatus 100 from a time t1 to a time t7 of FIG. 2.

In the first, second and third tanks 5, 6, 7, a first reference height L1 and a second reference height L2 are set in each of the storage tanks 5*b*, 6*b*, 7*b*. The first reference height L1 is set in the vicinity of a bottom portion of each of the storage tanks 5*b*, 6*b*, 7*b*, and the second reference height L2 is set higher than the first reference height L1 and in the vicinity of an upper end of each of the storage tanks 5*b*, 6*b*, 7*b*.

The first reference height L1 is set to a height of the liquid surface when about one fifth of the maximum capacity of each storage tank 5*b*, 6*b*, 7*b* of liquid is stored in each storage tank 5*b*, 6*b*, 7*b*, for example. Further, the second reference height L2 is set to a height of the liquid surface when about four fifth of the maximum capacity of each storage tank 5*b*, 6*b*, 7*b* of liquid is stored in each storage tank 5*b*, 6*b*, 7*b*, for example.

In the initial state, a phosphoric acid aqueous solution having predetermined phosphoric acid concentration (hereinafter referred to as reference phosphoric acid concentration) and the reference silicon concentration is stored in each of the first and second tanks 5, 6. In each of the first and second tanks 5, 6, the height of the liquid surface of the phosphoric acid aqueous solution is kept at the second reference height L2.

Further, a phosphoric acid aqueous solution not having the reference phosphoric acid concentration and the reference silicon concentration is stored in the third tank 7. In the third tank 7, the height of the liquid surface of the phosphoric acid aqueous solution is kept at the first reference height L1. The all valves 12, 17, 21, 26, 31, 36, 41, 42, 51, 52 shown in FIG. 1 are closed.

When the substrate processing apparatus 100 is turned on from the initial state, operations of the heaters 11, 14, 23, 33, the pumps 15, 24, 34 and the new liquid supply device 8 of FIG. 1 is started. In this state, the first substrate W is carried into the spin chuck 2 of the processor 1. Further, the substrate W is held and rotated by the spin chuck 2.

At the subsequent time t1 of FIG. 2, the controller 9 of FIG. 1 opens the valves 12, 17 of FIG. 1. Thus, as indicated by a thick arrow A1 in FIG. 3, the phosphoric acid aqueous solution in the storage tank 5b is sucked by the pump 15, and is sent to the filter 13 through the heater 14. The heater 14 heats the phosphoric acid aqueous solution passing through the first supply pipe 10 to a predetermined temperature (150° C., for example). The filter 13 removes unnecessary deposits and the like by filtering the phosphoric acid aqueous solution.

Figure 3:
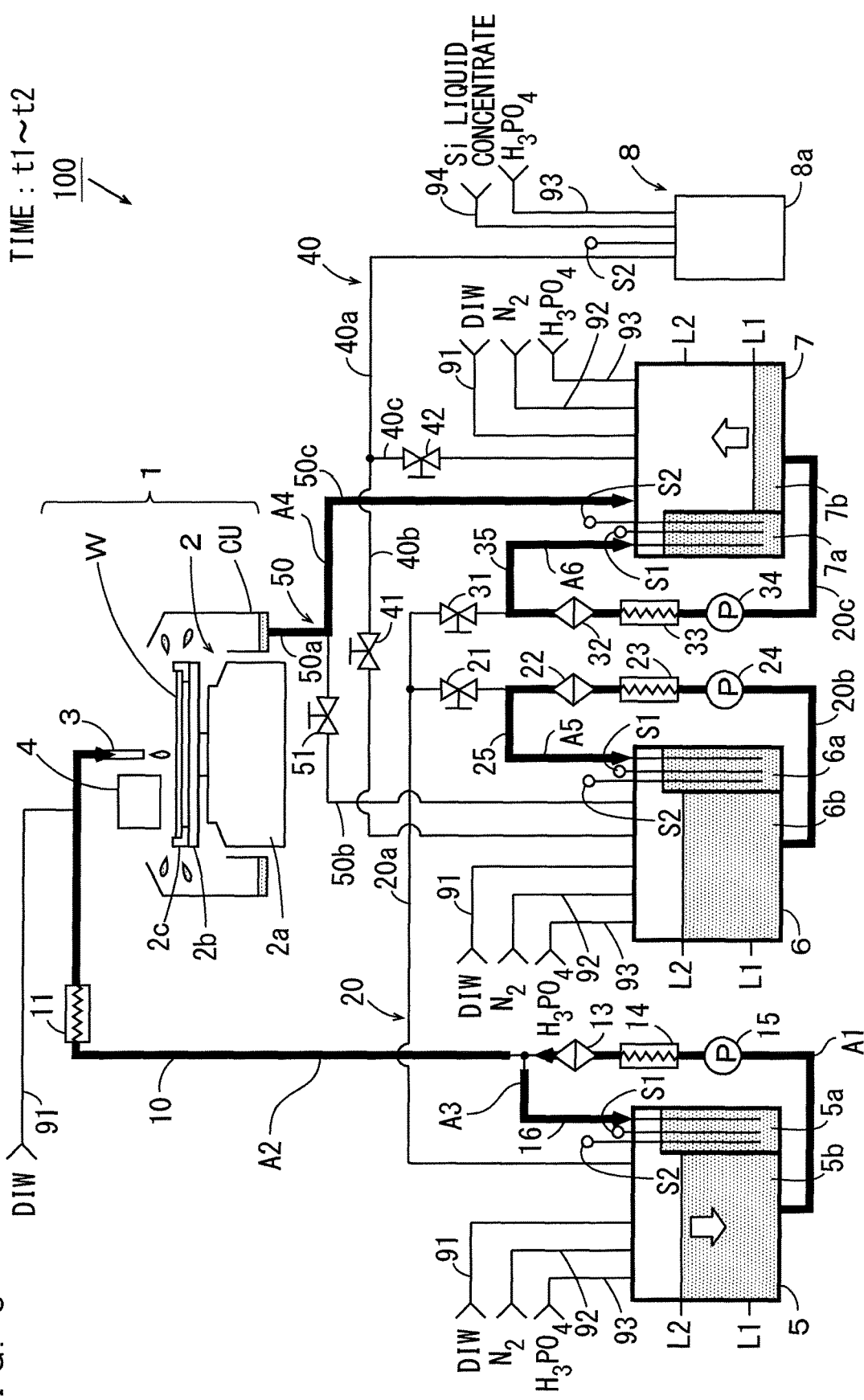
FIG. 3 is a schematic view showing the operations of the substrate processing apparatus from a time t1 to a time t7 of FIG. 2.
Figure 4:
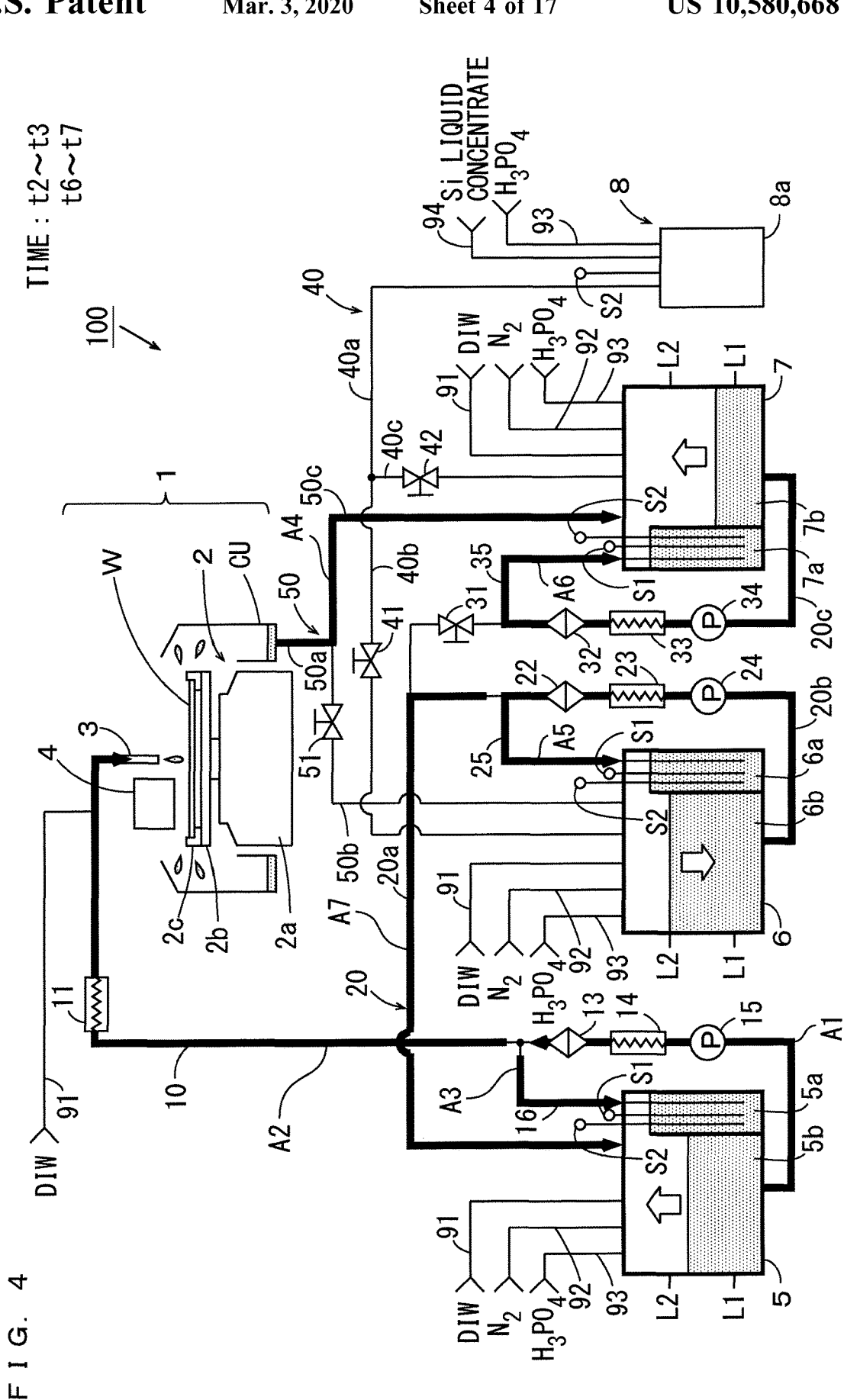
FIG. 4 is a schematic view showing the operations of the substrate processing apparatus from the time t1 to the time t7 of FIG. 2.

As indicated by a thick arrow A2 in FIG. 3, part of the phosphoric acid aqueous solution, which has passed through the heater 14 and the filter 13, is sent to the processing liquid nozzle 3 while being further heated by the heater 11. Thus, the phosphoric acid aqueous solution having the reference phosphoric acid concentration and the reference silicon concentration is supplied to the substrate W together with DIW from the processing liquid nozzle 3. The DIW is suitably supplied from the DIW supply system 91 to a portion located between the heater 11 and the supply liquid nozzle 3.

On the other hand, as indicated by a thick arrow A3 in FIG. 3, the rest of the phosphoric acid aqueous solution, which has passed through the heater 14 and the filter 13, is returned to the circulation tank 5a of the first tank 5 through the circulation pipe 16. In the first tank 5, the phosphoric acid aqueous solution overflowing from the circulation tank 5a flows into the storage tank 5b. In this manner, the phosphoric acid aqueous solution in the storage tank 5b passes through the first supply pipe 10, the circulation pipe 16 and the circulation tank 5a while being heated and filtered to return to the storage tank 5b. Thus, the temperature and cleanliness of the phosphoric acid aqueous solution in the storage tank 5b are kept substantially constant.

As described above, an operation of keeping temperature and cleanliness of the phosphoric acid aqueous solution in the storage tank 5b constant by heating and filtering of part of the phosphoric acid aqueous solution stored in the storage tank 5b and returning of the part of the phosphoric acid aqueous solution to the storage tank 5b is referred to as a circulation temperature control.

At the time t1, the controller 9 of FIG. 1 further opens the valve 52 of FIG. 1. Thus, as indicated by a thick arrow A4 in FIG. 3, the used phosphoric acid aqueous solution, which is collected by the cup CU of the processor 1, is sent to the storage tank 7b of the third tank 7 through the main pipe 50a and the branch pipe 50c. In this manner, an operation of sending the used phosphoric acid aqueous solution that has been supplied to the substrate W to the storage tank 7b is referred to as a liquid collection.

At the time t1, the controller 9 of FIG. 1 further opens the valves 26, 36 of FIG. 1. Thus, as indicated by thick arrows A5, A6, the circulation temperature control similar to the first tank 5 is also performed in the second tank 6 and the third tank 7.

Here, when the liquid collection and the circulation temperature control are performed in the third tank 7, phosphoric acid concentration of the phosphoric acid aqueous solution stored in the storage tank 7b is different from the reference phosphoric acid concentration. Therefore, the controller 9 of FIG. 1 controls the DIW supply system 91, the nitrogen gas supply system 92 and the phosphoric acid aqueous solution supply system 93 based on the output of the phosphoric acid concentration meter S1 of the third tank 7 such that the phosphoric acid concentration in the storage tank 7b becomes closer to the reference phosphoric acid concentration.

For example, when the output from the phosphoric acid concentration meter S1 is higher than the reference phosphoric acid concentration, the controller 9 controls the DIW supply system 91 such that the DIW is supplied to the storage tank 7b. Thus, the phosphoric acid concentration in the storage tank 7b is reduced, and is adjusted to the reference phosphoric acid concentration.

Further, when the output from the phosphoric acid concentration meter S1 is lower than the reference phosphoric acid concentration, the controller 9 controls the phosphoric acid aqueous solution supply system 93 such that a phosphoric acid aqueous solution having higher phosphoric acid concentration than the reference phosphoric acid concentration is supplied to the storage tank 7b. Thus, the phosphoric acid concentration in the storage tank 7b is increased, and is adjusted to the reference phosphoric acid concentration.

Further, when the output from the phosphoric acid concentration meter S1 is lower than the reference phosphoric acid concentration, the controller 9 controls the nitrogen gas supply system 92 such that a nitrogen gas is supplied to the storage tank 7b. In this case, evaporation of the phosphoric acid aqueous solution in the storage tank 7b is promoted. Thus, the phosphoric acid concentration in the storage tank 7b is increased, and is adjusted to the reference phosphoric acid concentration.

The controller 9 may supply one of the phosphoric acid aqueous solution having high phosphoric acid concentration and the nitrogen gas to the storage tank 7b, or may supply both to the storage tank 7b in order to increase the phosphoric acid concentration in the storage tank 7b.

As described above, an operation of adjusting the phosphoric acid concentration of the phosphoric acid aqueous solution in the storage tank 7b to the reference phosphoric acid concentration is referred to as a phosphoric acid concentration adjustment.

As shown in FIG. 2, supply of the phosphoric acid aqueous solution to the processing liquid nozzle 3 and the circulation temperature control are started in the first tank 5 at the time t1. The circulation temperature control is also started in the second tank 6 and the third tank 7. In the third tank 7, the liquid collection and the phosphoric acid concentration adjustment are started.

The supply of the phosphoric acid aqueous solution from the first tank 5 to the processing liquid nozzle 3 is continued until the processing of the substrate W is finished. Further, the circulation temperature control in the first tank 5, the second tank 6 and the third tank 7 is continued until the processing of the substrate W is finished.

When it is detected by the liquid surface sensor S3 that the height of the liquid surface in the storage tank 5b of the first tank 5 is lowered by a predetermined height from the second reference height L2, the controller 9 of FIG. 1 opens the valve 21 of FIG. 1 (the time t2).

Thus, the supply of the phosphoric acid aqueous solution from the second tank 6 to the first tank 5 is started. As indicated by a thick arrow A7 in FIG. 4, part of the phosphoric acid aqueous solution, which has flowed in the branch pipe 20b from the storage tank 6b of the second tank 6 to pass through the filter 22, is sent to the storage tank 5b of the first tank 5 through the main pipe 20a. In this manner, the phosphoric acid aqueous solution having the reference phosphoric acid concentration and the reference silicon concentration is supplied from the second tank 6 to the first tank 5. Thus, the height of the liquid surface in the storage tank 5b is lifted towards the second reference height L2, and the height of the liquid surface in the storage tank 6b is lowered from the second reference height L2 (see outlined arrows in FIG. 4)

When it is detected by the liquid surface sensor S3 that the height of the liquid surface in the storage tank 5b of the first tank 5 has reached the second reference height L2, the controller 9 of FIG. 1 stops the supply of the phosphoric acid aqueous solution from the second tank 6 to the first tank 5 by closing the valve 21 of FIG. 1 (the time t3).

While the phosphoric acid aqueous solution is supplied from the second tank 6 to the first tank 5 from the time t2 to the time t3, the liquid collection and the phosphoric acid concentration adjustment are concurrently performed in the third tank 7. Thus, the height of the liquid surface in the storage tank 7b of the third tank 7 is lifted from the first reference height L1 (see an outlined arrow in FIG. 4).

The liquid collection in the third tank 7 is stopped and the liquid collection in the second tank 6 is started at the time t3. That is, the controller 9 closes the valve 52 and opens the valve 51 of FIG. 1. Thus, the used phosphoric acid aqueous solution, which has been collected by the cup CU of the processor 1, is sent to the storage tank 6b of the second tank 6 (see a thick arrow A8 in FIG. 5). The phosphoric acid concentration adjustment is concurrently performed with the liquid collection in the second tank 6.

Here, in the single-substrate processing apparatus, part of the processing liquid is discarded by rinse processing and the like. Therefore, all of the processing liquid that is used for the processing of the substrate W cannot be collected. Therefore, even when the height of the liquid surface in the storage tank 6b is lowered from the second reference height L2 to the first reference height L1 with the height of the liquid surface in the storage tank 5b being kept at the second reference height L2, the height of the liquid surface in the storage tank 7b is not lifted from the first reference height L1 to the second reference height L2.

The controller 9 of FIG. 1 controls the valve 42 and the new liquid supply device 8 of FIG. 1 based on the outputs of the liquid surface sensor S3 of the third tank 7 (FIG. 1) and the silicon concentration meter S2 such that the height of the liquid surface in the storage tank 7b is lifted to the second reference height L2 and the silicon concentration of the phosphoric acid aqueous solution in the storage tank 7b becomes closer to the reference silicon concentration.

For example, when the output from the silicon concentration meter S2 of the third tank 7 is equal to the reference silicon concentration, the controller 9 opens the valve 42 of FIG. 1. Thus, as indicated by a thick arrow A9 in FIG. 5, the phosphoric acid aqueous solution having the reference phosphoric acid concentration and the reference silicon concentration is supplied from the new liquid supply device 8 to the third tank 7. As a result, the height of the liquid surface in the storage tank 7b is lifted to the second reference height L2, and the silicon concentration in the storage tank 7b is kept at the reference silicon concentration.

The controller 9 of the present example can adjust the silicon concentration in the mixing tank 8a of the new liquid supply device 8 to a value different from the reference silicon concentration based on the silicon concentration meter S2 provided in the new liquid supply device 8.

When the output from the silicon concentration meter S2 of the third tank 7 is lower than the reference silicon concentration, the controller 9 controls the new liquid supply device 8 such that the silicon concentration in the mixing tank 8a is lifted. Thus, a phosphoric acid aqueous solution having the silicon concentration higher than the reference silicon concentration is supplied from the new liquid supply device 8 to the third tank 7. As a result, the height of the liquid surface in the storage tank 7b is lifted to the second reference height L2, and the silicon concentration in the storage tank 7b is lifted to be adjusted to the reference silicon concentration.

Further, when the output from the silicon concentration meter S2 of the third tank 7 is higher than the reference silicon concentration, the controller 9 controls the new liquid supply device 8 such that the silicon concentration in the mixing tank 8a is reduced. Thus, a phosphoric acid aqueous solution having silicon concentration lower than the reference silicon concentration is supplied from the new liquid supply device 8 to the third tank 7. As a result, the height of the liquid surface in the storage tank 7b is lifted to the second reference height L2, and the silicon concentration in the storage tank 7b is reduced to be adjusted to the reference silicon concentration.

As described above, an operation of lifting the height of the liquid surface in the storage tank 7b to the second reference height L2 and adjusting silicon acid concentration of the phosphoric acid aqueous solution in the storage tank to the reference silicon acid concentration is referred to as a silicon concentration adjustment.

At a time of the silicon concentration adjustment, part of the phosphoric acid aqueous solution stored in the storage tank 7b may be discarded through a discard pipe (not shown). Even in such a case, the phosphoric acid aqueous solution including silicon is supplied from the new liquid supply device 8 to the storage tank 7b. Therefore, shortage of the phosphoric acid aqueous solution, which is used for the processing of the substrate W, is prevented.

In the silicon concentration adjustment, the silicon concentration and the phosphoric acid concentration of the phosphoric acid aqueous solution are adjusted. For example, similarly to the phosphoric acid concentration adjustment, the controller 9 of FIG. 1 controls the DIW supply system 91, the nitrogen gas supply system 92 and the phosphoric acid aqueous solution supply system 93 based on the output from the phosphoric acid concentration meter S1 of the third tank 7 such that the phosphoric acid concentration becomes closer to the reference phosphoric acid concentration. Thus, even when the phosphoric acid aqueous solution being supplied from the new liquid supply device 8 to the third tank 7 does not have the reference phosphoric acid concentration, the phosphoric acid concentration in the storage tank 7b is adjusted to the reference phosphoric acid concentration.

When it is detected by the phosphoric acid concentration meter S1 and the silicon concentration meter S2 that the phosphoric acid aqueous solution having the reference phosphoric acid concentration and the reference silicon concentration is stored in the storage tank 7b of the third tank 7, the controller 9 stops the supply of the phosphoric acid aqueous solution from the new liquid supply device 8 to the third tank 7, and finishes the silicon concentration adjustment in the third tank 7 (the time t4).

Figure 5:
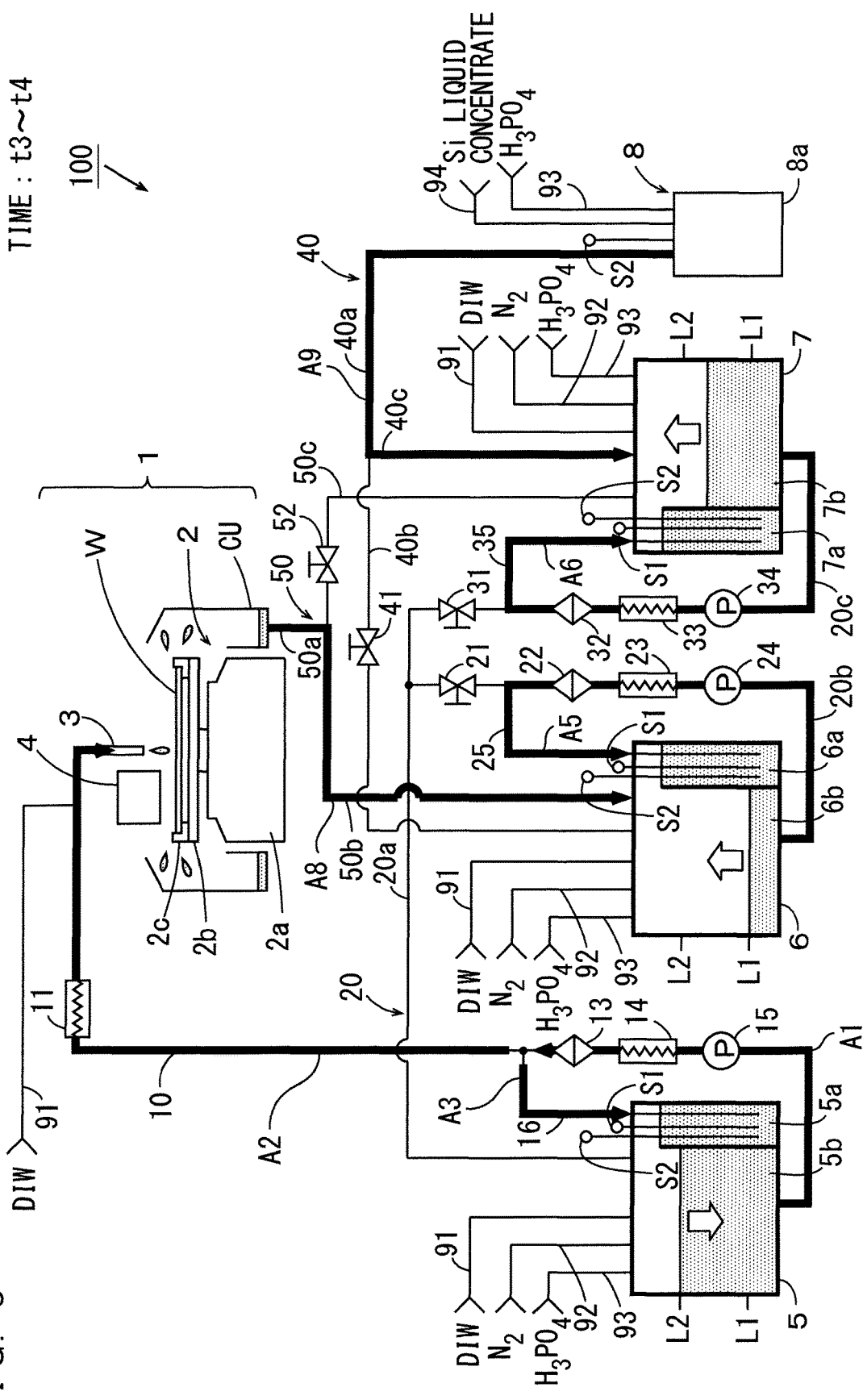
FIG. 5 is a schematic view showing the operations of the substrate processing apparatus from the time t1 to the time t7 of FIG. 2.
Figure 6:
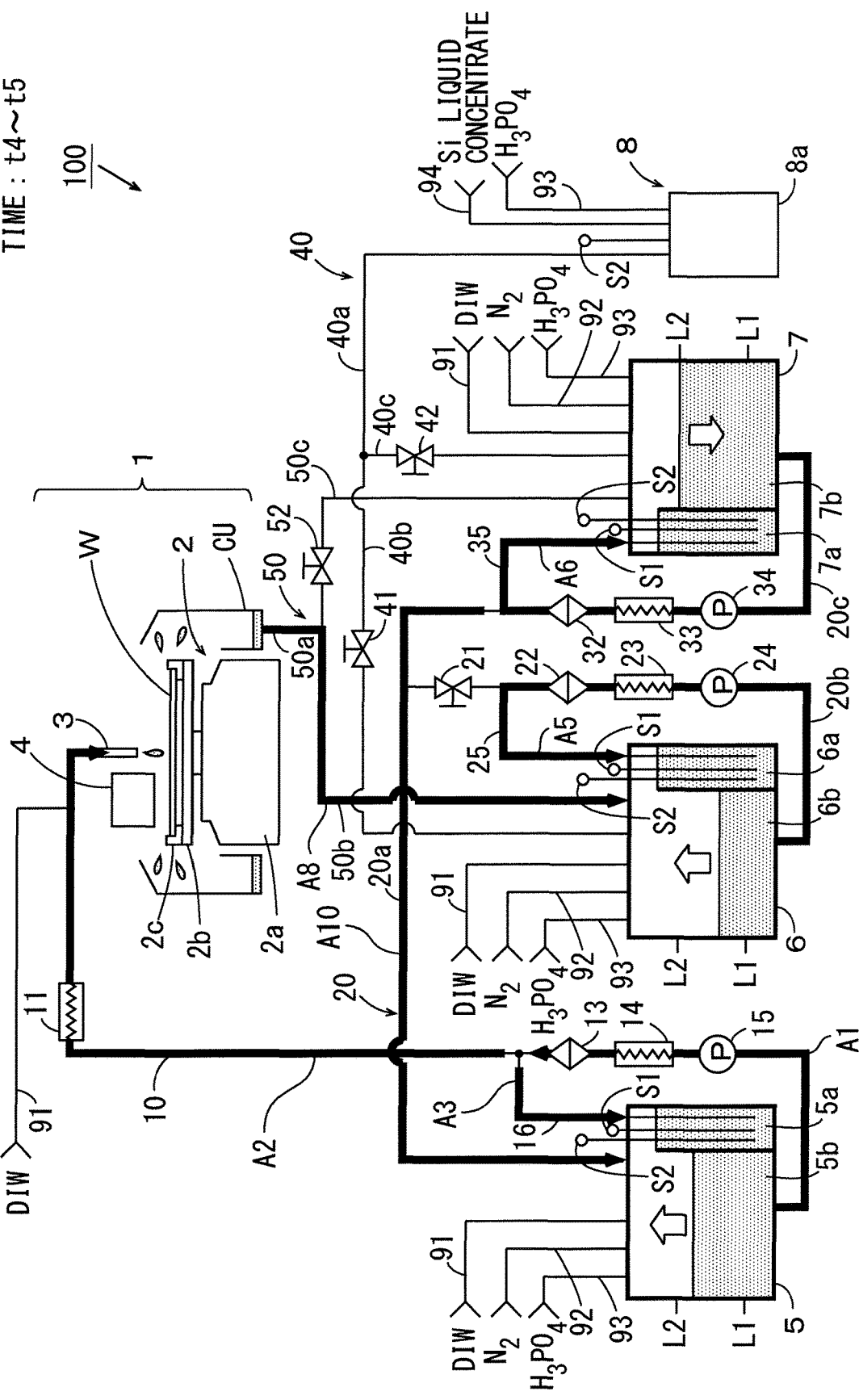
FIG. 6 is a schematic view showing the operations of the substrate processing apparatus from the time t1 to the time t7 of FIG. 2.

As shown in FIGS. 2 and 5, the supply of the phosphoric acid aqueous solution from the first tank 5 to the processor 1 is continued from the time t3 to the time t4, so that a height of the liquid surface in the storage tank 5b is lowered from the second reference height L2. Further, the liquid collection is continued in the second tank 6, so that a height of the liquid surface in the storage tank 6b is lifted from the first reference height L1.

In the present embodiment, a time period, which is required from the time when the silicon concentration adjustment is started until the time when the silicon concentration adjustment is completed in the second tank 6 and the third tank 7, is sufficiently short as compared to a time period that is required from the time when the height of the liquid surface in the storage tank 5b is lowered from the second reference height L2 to the first reference height L1 by the processing of the substrate W.

The controller 9 of FIG. 1 may determine the time t4 at which the silicon concentration adjustment is completed when a state, in which a height of the liquid surface in the storage tank 7b is equal to the second reference height L2 and the phosphoric acid concentration and silicon concentration in the storage tank 7b are at the reference phosphoric acid concentration and the reference silicon concentration, is continued for a constant time period.

The controller 9 starts to supply the phosphoric acid aqueous solution having the reference phosphoric acid concentration and the reference silicon concentration from the third tank 7 towards the first tank 5 at the time t4. Thus, as indicated by a thick arrow A10 in FIG. 6, part of the phosphoric acid aqueous solution, which has flowed in the branch pipe 20c from the storage tank 7b of the third tank 7 to pass through the filter 32 is sent to the storage tank 5b of the first tank 5 through the main pipe 20a. Thus, a height of the liquid surface in the storage tank 5b of the first tank 5 is lifted towards the second reference height L2.

When it is detected that a height of the liquid surface of the first tank 5 is equal to the second reference height L2, the controller 9 stops the supply of the phosphoric acid aqueous solution from the third tank 7 to the first tank 5 (the time t5). In the second tank 6, a height of the liquid surface in the storage tank 6b is lifted by the liquid collection from the time t3 to the time t5.

At the time t5, the liquid collection in the second tank 6 is stopped, and the liquid collection in the third tank 7 is started. That is, the controller 9 closes the valve 51 and opens the valve 52 of FIG. 1. Thus, the used phosphoric acid aqueous solution, which has been collected by the cup CU of the processor 1, is sent to the storage tank 7b of the third tank 7 (see the thick arrow A4 of FIG. 7). The phosphoric acid concentration adjustment is concurrently performed with the liquid collection in the third tank 7.

Further, from the time t5, the silicon concentration adjustment in the second tank 6 is started. That is, the controller 9 opens the valve 41 of FIG. 1 and controls the new liquid supply device 8. Thus, as indicated by a thick arrow A11 in FIG. 7, the phosphoric acid aqueous solution in which the silicon concentration is adjusted is supplied from the new liquid supply device 8 to the second tank 6. Further, the silicon concentration of the phosphoric acid aqueous solution in the storage tank 6b is kept at the reference silicon concentration.

When it is detected by the silicon concentration meter S2 that the phosphoric acid aqueous solution having the reference phosphoric acid concentration and the reference silicon concentration is stored in the storage tank 6b of the second tank 6, the controller 9 of FIG. 1 stops the supply of the phosphoric acid aqueous solution from the new liquid supply device 8 to the second tank 6 and finishes the silicon concentration adjustment in the second tank 6 (the time t6).

Figure 7:
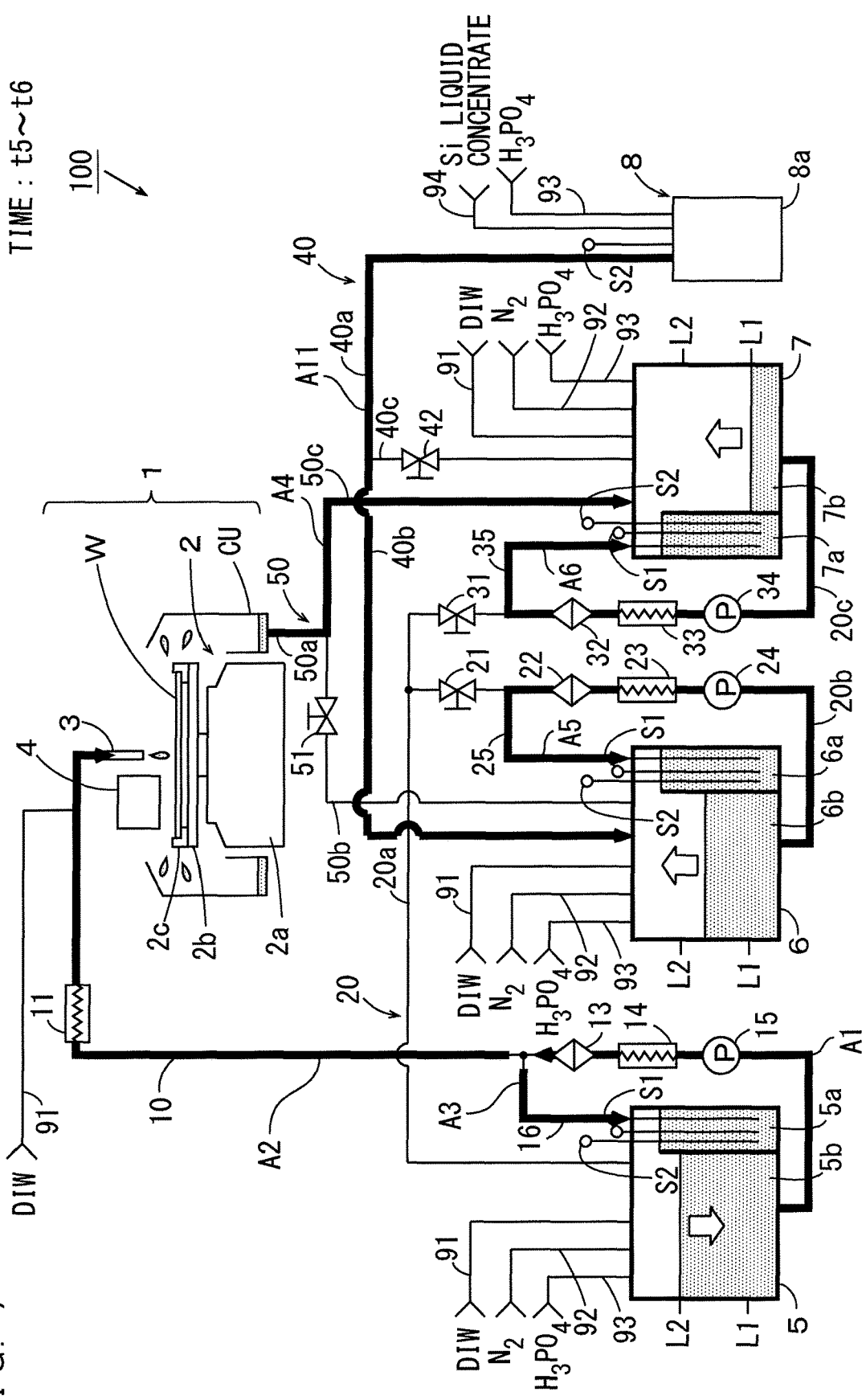
FIG. 7 is a schematic view showing the operations of the substrate processing apparatus from the time t1 to the time t7 of FIG. 2.

As shown in FIGS. 2 and 7, the supply of the phosphoric acid aqueous solution from the first tank 5 to the processor 1 is continued from the time t5 to the time t6, so that the height of the liquid surface in the storage tank 5b is lowered from the second reference height L2. Further, because the liquid collection is continued in the third tank 7, the height of the liquid surface in the storage tank 7b is lifted from the first reference height L1. The phosphoric acid concentration adjustment is concurrently performed with the liquid collection in the third tank 7.

As shown in FIG. 2, the supply of the phosphoric acid aqueous solution is performed from the second tank 6 to the first tank 5 from the time t6. Thus, the height of the liquid surface in the storage tank 6b of the second tank 6 is lowered from the second reference height L2, and the height of the liquid surface in the storage tank 5b of the first tank 5 is lifted towards the second reference height L2. The supply of the phosphoric acid aqueous solution from the second tank 6 to the first tank 5 is performed until the height of the liquid surface of the first tank 5 reaches the second reference height L2 (the time t7).

At the time t7 and later, the operation being performed from the time t3 to the time t5 and the operation being performed from the time t5 to the time t7 are repeated until the processing of the substrates W is stopped. Thus, the phosphoric acid aqueous solution having the reference phosphoric acid concentration and the reference silicon concentration is always kept in the first tank 5.

In the first tank 5, moisture of part of the phosphoric acid aqueous solution may evaporate. In this case, the phosphoric acid concentration and silicon concentration of the phosphoric acid aqueous solution stored in the storage tank 5b is changed. Therefore, the controller 9 may perform the phosphoric acid concentration adjustment in the first tank 5 based on the output of the phosphoric acid concentration meter S1 of the first tank 5. Further, the controller 9 may output an abnormal signal when the output of the silicon concentration meter S2 of the first tank 5 indicates an abnormal value.

Further, when the phosphoric acid aqueous solution is not supplied to the first tank 5 due to abnormality or the like of the apparatus, the height of the liquid surface in the storage tank 5b may be lower than the first reference height L1. Therefore, the controller 9 may output the abnormal signal when the output of the liquid surface sensor S3 of the first tank 5 indicates a level that is lower than the first reference height L1.

(3) Effects

In the substrate processing apparatus 100 according to the first embodiment, the processing liquid being used in the processor 1 is collected and reused. Therefore, the substrate processing can be performed with the small amount of processing liquid. Further, the processing liquid is constantly supplied from the first tank 5 to the processor 1. Therefore, downtime is not generated in the substrate processing apparatus 100, so that the substrate processing can be performed with high productivity.

There is a problem that the concentration is unstable and fluctuates because a rinse liquid and the like are mixed in the collected processing liquid from the processor 1. Therefore, the processing liquid in the second tank 6 (or the third tank 7) collecting the processing liquid from the processor 1 has the unstable phosphoric acid concentration and silicon concentration during the liquid collection period. Therefore, the second tank 6 (or the third tank 7) collecting the processing liquid from the processor 1 cannot directly supply the processing liquid to the processor 1.

In the substrate processing apparatus 100, the concentration adjustment is performed for a predetermined time period (a period from the time t5 to the time t6 (or the time t3 to the time t4)) after the collection of the processing liquid from the processor 1 is finished. Thus, the processing liquid, which is adjusted to have the reference phosphoric acid concentration and the reference silicon concentration, can be supplied from the second tank 6 (or the third tank 7) to the first tank 5.

If the above-mentioned concentration adjustment is performed after the liquid collection in a case in which there are only two tanks, a time period in which one of the liquid collection and the substrate processing is stopped is generated.

Figure 8:
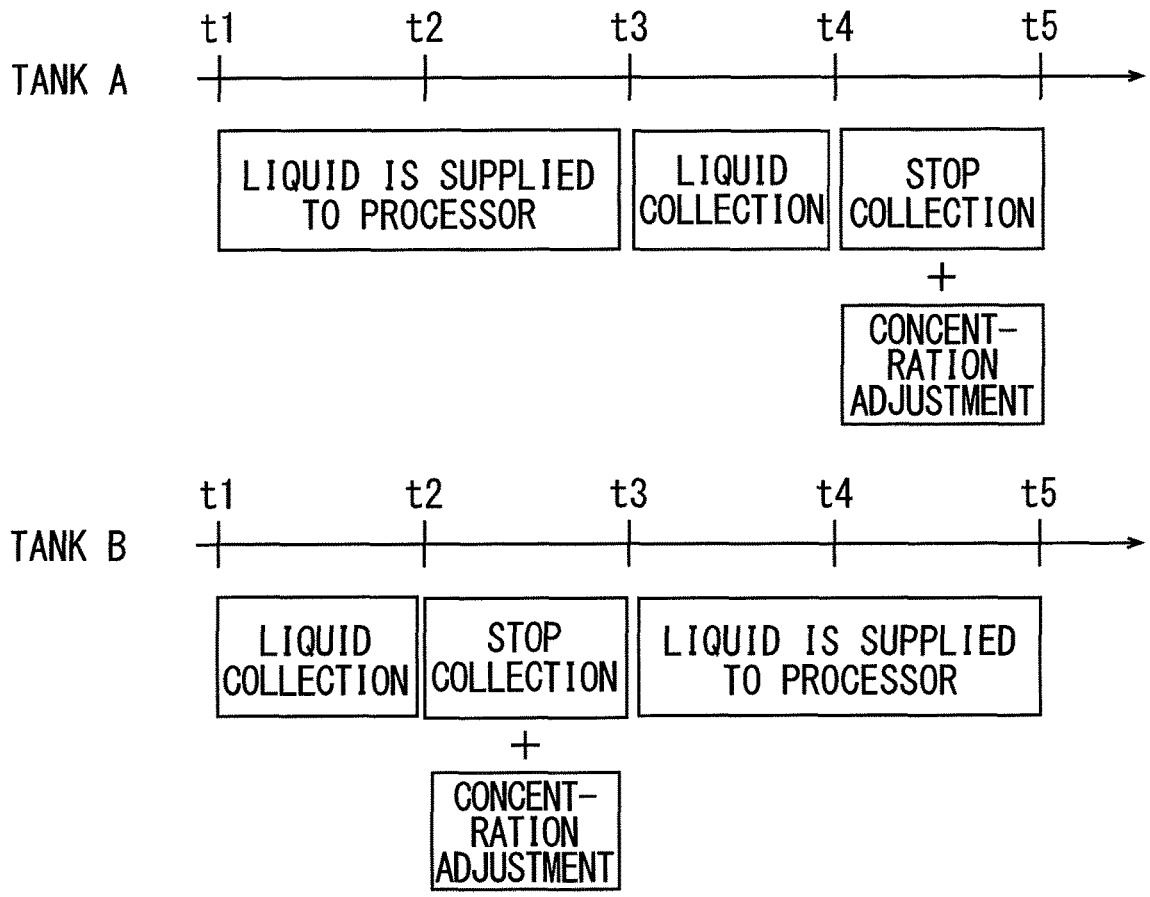
FIG. 8 is a time chart according to a first comparative example for explaining effects of the substrate processing apparatus according to the first embodiment.

FIG. 8 is a first comparative example in which the above-mentioned concentration adjustment (the silicon concentration adjustment including the phosphoric acid concentration adjustment) is performed on a processing liquid stored in each tank in the case in which there are only two tanks. The two tanks being used in the first comparative example are referred to as a tank A and a tank B. The tank A supplies the processing liquid to a processor 1 in a period from a time t1 to a time t3. The tank B collects the processing liquid from the processor 1 from the time t1 to the time t2. The tank B then performs the concentration adjustment (the adjustment of the silicon concentration and phosphoric acid concentration of the processing liquid) while the liquid collection is stopped from the time t2 to the time t3. The adjustment of the silicon concentration and phosphoric acid concentration is performed from the time t2 to a time t3, so that the processing liquid in the tank B can be stabilized to have the reference silicon concentration and the reference phosphoric acid concentration.

The tank B supplies the processing liquid to the processor 1 from the time t3 to a time t5. On the other hand, the tank A performs the liquid collection from the time t3 to a time t4, and performs the concentration adjustment while the liquid collection is stopped from the time t4 to the time t5.

In this manner, in the first comparative example, a period in which the liquid collection is stopped (a period from the time t2 to the time t3, and a period from the time t4 to the time t5) is generated. The processing liquid, which has been used in the processor 1 during this period, is discarded without being collected, so that the processing liquid cannot be effectively utilized.

Figure 9:
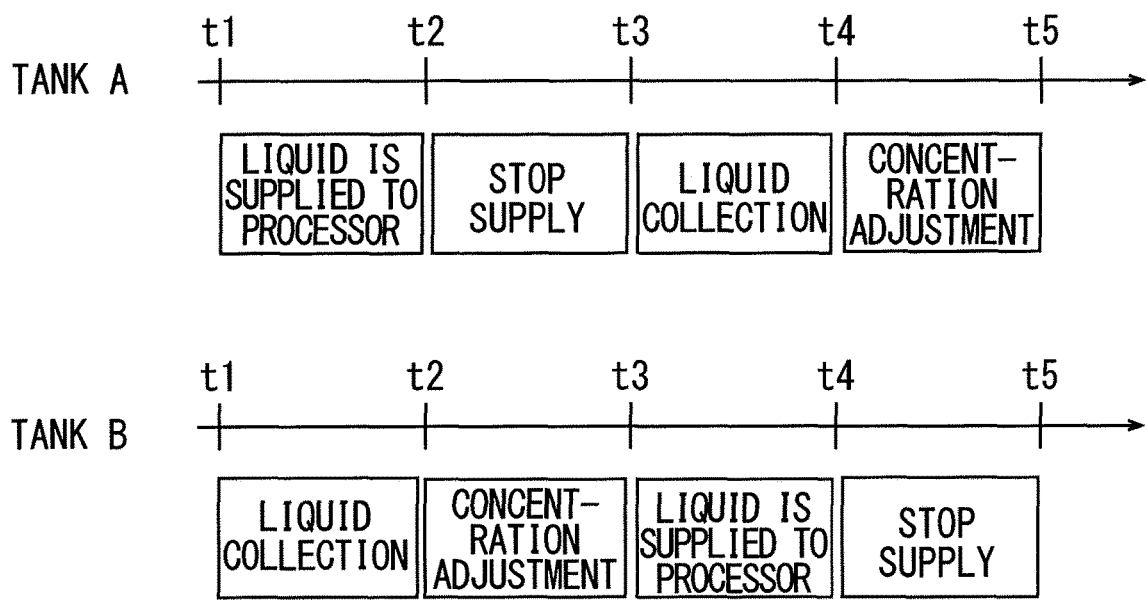
FIG. 9 is a time chart according to a second comparative example for explaining the effects of the substrate processing apparatus according to the first embodiment.

FIG. 9 is a second comparative example in which the above-mentioned concentration adjustment (the silicon concentration adjustment including the phosphoric acid concentration adjustment) is performed on the processing liquid stored in each tank in the case in which there are only two tanks. Similarly to the first comparative example, two tanks being used in the second comparative example are referred to as a tank A and a tank B. The tank A supplies the processing liquid to a processor 1 during a period from a time t1 to a time t2. The tank B collects the processing liquid from the processor 1 during the period from the time t1 to the time t2. During a period from the time t2 to a time t3, the concentration adjustment in the tank B is performed while supply of the processing liquid from the tank A to the processor 1 is stopped.

The tank B supplies the processing liquid from the processor 1 during a period from the time t3 to a time t4. The tank A collects the processing liquid from the processor 1 during the period from the time t3 to the time t4. During a period from the time t4 to a time t5, the concentration adjustment in the tank A is performed while supply of the processing liquid from the tank B to the processor 1 is stopped.

In this manner, in the second comparative example, downtime in which substrate processing in the processor 1 is stopped (during the period from the time t2 to the time t3 and during the period from the time t4 to the time t5) is generated, so that productivity of the substrate processing is reduced.

In a case of the substrate processing apparatus 100 according to the first embodiment, the processing liquid collection is not stopped dissimilarly to the first comparative example. That is, as shown in FIG. 2, the liquid collection is constantly alternately performed in the second tank 6 and the third tank 7. Therefore, the substrate processing apparatus 100 can efficiently utilize the processing liquid.

Further, in the case of the substrate processing apparatus 100 according to the first embodiment, the downtime is not generated dissimilarly to the second comparative example. That is, as shown in FIG. 2, the first tank 5 continues to constantly supply the processing liquid towards the processor 1. Therefore, the substrate processing apparatus 100 can perform the substrate processing with high productivity.

Figure 10A:
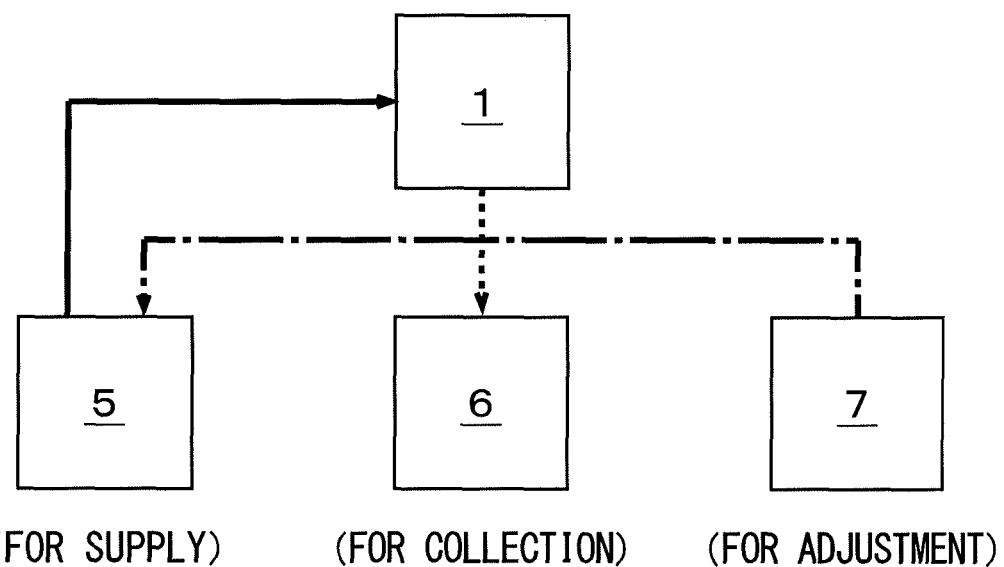
FIGS. 10A and 10B are diagrams for explaining the effects of the substrate processing apparatus according to the first embodiment.
Figure 10B:
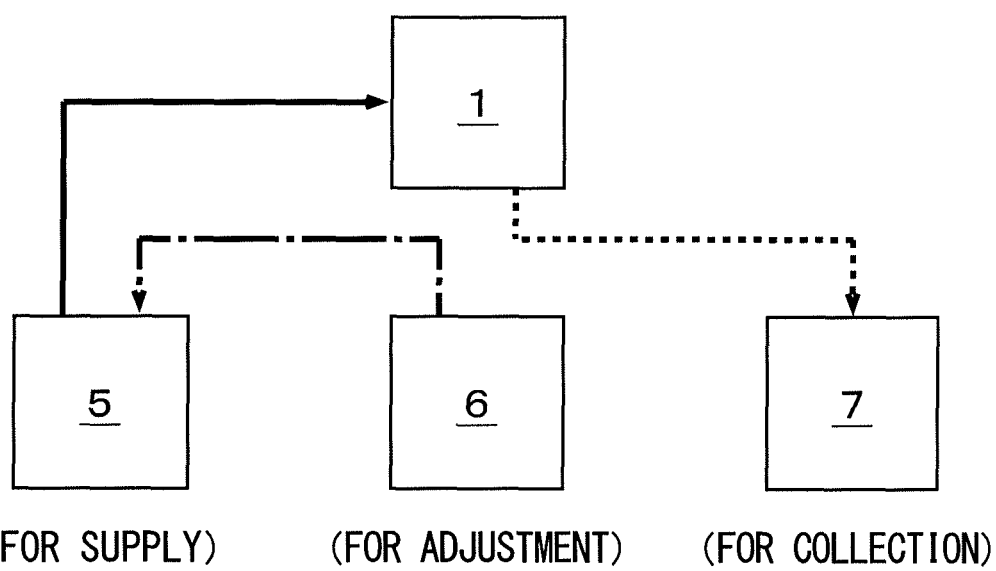

FIGS. 10A and 10B are diagrams for explaining the effects of the substrate processing apparatus 100 according to the first embodiment. The operation being performed from the time t4 to the time t5 of FIG. 2 in the first, second and third tanks 5, 6, 7 is shown in FIG. 10A. Further, the operation being performed from the time t6 to the time t7 of FIG. 2 in the first, second and third tanks 5, 6, 7 is shown in FIG. 10B.

As shown in FIGS. 10A and 10B, the supply operation of the phosphoric acid aqueous solution from the first tank 5 to the processor 1 (see thick solid arrows) and the liquid collection from the processor 1 to the second tank 6 or the third tank 7 (see thick dotted lines) are concurrently performed. The phosphoric acid aqueous solution is supplied from the first tank 5 to the processing liquid nozzle 3 of FIG. 1 by the supply operation. Further, the phosphoric acid aqueous solution is collected from the processor 1 to the second tank 6 or the third tank 7 by the liquid collection. Further, the silicon concentration in the third tank 7 or the second tank 6 is adjusted by the silicon concentration adjustment.

In this case, the phosphoric acid aqueous solution being collected from the processor 1 is not supplied to a tank in which the silicon concentration adjustment is performed. Therefore, the silicon concentration can be accurately adjusted in the tank in which the silicon concentration adjustment is performed.

As shown in FIGS. 10A and 10B, the adjusted processing liquid is supplied to the processor 1 through the first tank 5 after the silicon concentration adjustment is completed (see thick one-dot dash arrows). Thus, the substrate W can be processed by the phosphoric acid aqueous solution in which the concentration is accurately adjusted. Further, the tank in which the liquid collection is performed is changed to a tank for the silicon concentration adjustment after the liquid collection is finished. Thus, the silicon concentration of the collected phosphoric acid aqueous solution can be accurately adjusted.

In this manner, it is possible to accurately adjust the silicon concentration of the phosphoric acid aqueous solution without stopping the supply operation of the phosphoric acid aqueous solution to the processor 1 and the liquid collection. As a result, uniform processing can be performed with high accuracy while a reduction in processing efficiency of the substrates W is prevented.

Further, because the collected phosphoric acid aqueous solution is not supplied but the adjusted phosphoric acid aqueous solution is supplied to the first tank 5 of the present example, contamination of the first tank 5 is prevented, and the phosphoric acid concentration and silicon concentration of the phosphoric acid aqueous solution in the first tank 5 is kept constant.

[2] Second Embodiment

In the first embodiment, the first tank 5 is only used to supply the phosphoric acid aqueous solution to the processor 1. Further, the second tank 6 and the third tank 7 are used to collect the phosphoric acid aqueous solution and adjust the silicon concentration and phosphoric acid concentration of the phosphoric acid aqueous solution.

However, the phosphoric acid aqueous solution may be supplied from each of the first tank 5, the second tank 6 and the third tank 7 to the processor 1. Further, each of the first tank 5, the second tank 6 and the third tank 7 may be used to collect the phosphoric acid aqueous solution and adjust the silicon concentration and phosphoric acid concentration of the phosphoric acid aqueous solution.

Figure 11:
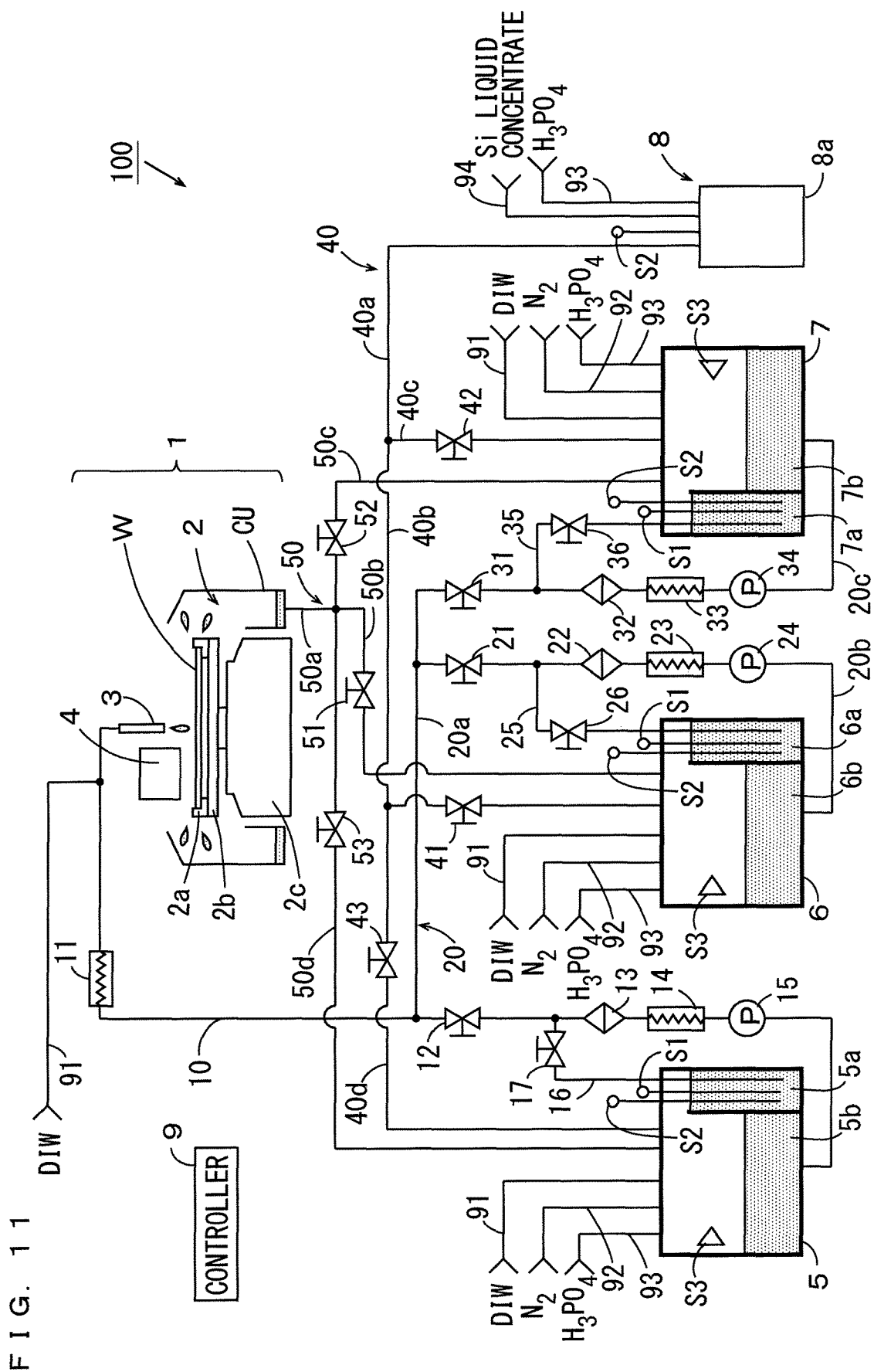
FIG. 11 is a schematic view showing the configuration of a substrate processing apparatus according to a second embodiment.

FIG. 11 is a schematic view showing the configuration of a substrate processing apparatus according to the second embodiment. The substrate processing apparatus 100 of FIG. 11 has the same configuration as the substrate processing apparatus 100 of FIG. 1 except for the following points.

As shown in FIG. 11, in the present example, the main pipe 20a of the second supply pipe 20 of FIG. 1 is connected to a portion, of a first supply pipe 10, that is located between a valve 12 and a heater 11. Further, a pipe having one main pipe 50a and three branch pipes 50b, 50c, 50d is used as a collection pipe 50. The branch pipes 50b, 50c, 50d are connected to the main pipe 50a. The main pipe 50a of the collection pipe 50 is connected to a cup CU, and the three branch pipes 50d, 50b, 50c are respectively connected to storage tanks 5b, 6b, 7b of first, second and third tanks 5, 6, 7. A valve 51 is inserted into the branch pipe 50b, a valve 52 is inserted into the branch pipe 50c and a valve 53 is inserted into the branch pipe 50d.

Further, a pipe having one main pipe 40a and three branch pipes 40b, 40c, 40d is used as a third supply pipe 40. The branch pipes 40b, 40c are connected to the main pipe 40a. The main pipe 40a of the third supply pipe 40 is connected to a new liquid supply device 8, and the two branch pipes 40b, 40c are respectively connected to the storage tanks 6b, 7b of the respective second and third tanks 6, 7. A valve 41 is inserted into the branch pipe 40b, and a valve 42 is inserted into the branch pipe 40c.

The branch pipe 40d is connected to a portion, of the branch pipe 40b, that is located at the upstream of the valve 41. The branch pipe 40d is connected to the storage tank 5b of the first tank 5. A valve 43 is inserted into the branch pipe 40d.

The above-mentioned configuration enables the phosphoric acid aqueous solution stored in each of the first, second and third tanks 5, 6, 7 to be supplied to a processor 1 by opening of one valve of valves 12, 21, 31 and closing of another valve of valves 12, 21, 31 in the substrate processing apparatus 100 of the present example.

Further, it is possible to selectively supply the phosphoric acid aqueous solution collected by the cup CU of the processor 1 to any one of the first, second and third tanks 5, 6, 7 by opening one valve of the valves 51, 52, 53 and closing another valve of the valves 51, 52, 53. That is, the liquid collection can be performed in each of the first, second and third tanks 5, 6, 7.

Further, it is possible to selectively supply the phosphoric acid aqueous solution in which the silicon concentration and the phosphoric acid concentration are adjusted to any one of the first, second and third tanks 5, 6, 7 by the new liquid supply device 8 by opening one valve of the valves 41, 42, 43 and closing another valve of the valves 41, 42, 43. That is, the silicon concentration adjustment can be performed in each of the first, second and third tanks 5, 6, 7.

Figure 12A:
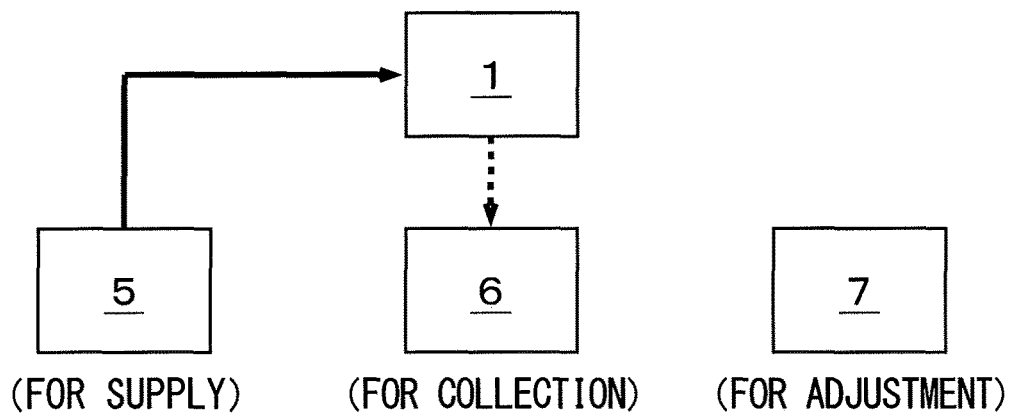
FIGS. 12A to 12C are diagrams for explaining effects of the substrate processing apparatus according to the second embodiment.
Figure 12B:
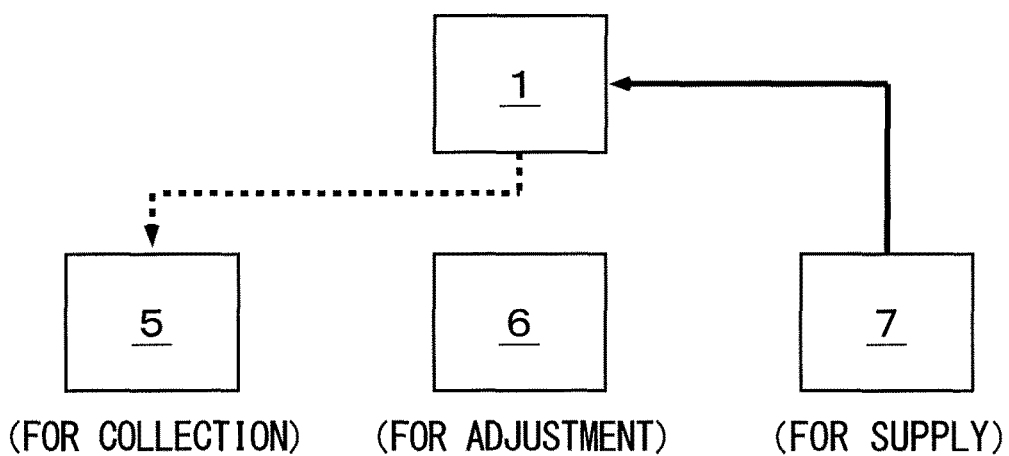
Figure 12C:
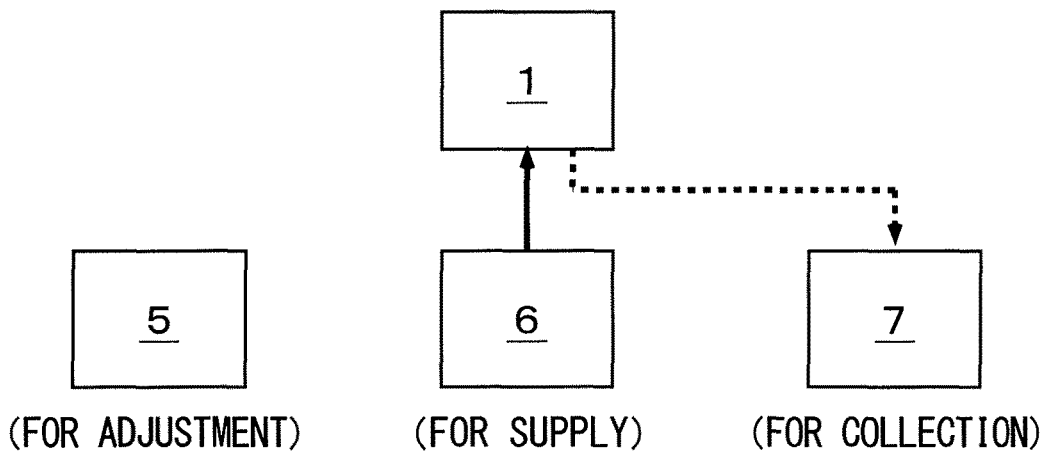

FIGS. 12A to 12C are diagrams for explaining the effects of the substrate processing apparatus according to the second embodiment. FIG. 12A shows an example in which the supply operation of the phosphoric acid aqueous solution from the first tank 5 to the processor 1 (see a thick solid arrow) and the liquid collection from the processor 1 to the second tank 6 (see a thick dotted arrow in FIG. 12) are concurrently performed.

FIG. 12B shows an example in which the supply operation of the phosphoric acid aqueous solution from the third tank 7 to the processor 1 (see a thick solid arrow) and the liquid collection from the processor 1 to the first tank 5 (see a thick dotted arrow) are concurrently performed.

FIG. 12C shows an example in which the supply operation of the phosphoric acid aqueous solution from the second tank 6 to the processor 1 (see a thick solid arrow) and the liquid collection from the processor 1 to the third tank 7 (see a thick dotted arrow) are concurrently performed.

In the present example, as shown in FIGS. 12A to 12C, the phosphoric acid aqueous solution is supplied from any one tank of the first, second and third tanks 5, 6, 7 to the processing liquid nozzle 3 of FIG. 1, and the phosphoric acid aqueous solution is collected from the processor 1 to another tank. Further, the silicon concentration adjustment including the adjustment of the phosphoric acid concentration is performed in the tank in which neither the supply operation nor the liquid collection is performed. Thus, the silicon concentration and the phosphoric acid concentration can be accurately adjusted.

The adjusted phosphoric acid aqueous solution is supplied from the tank that is used for the silicon concentration adjustment to the processor 1 after the silicon concentration adjustment is completed. Thus, the substrate W can be processed by the phosphoric acid aqueous solution in which the concentration is accurately adjusted. Further, the tank in which the liquid collection is performed is changed to the tank for the silicon concentration adjustment. Thus, the silicon concentration of the collected phosphoric acid aqueous solution can be accurately adjusted.

In this manner, it is possible to accurately adjust the silicon concentration and phosphoric acid aqueous solution of the phosphoric acid aqueous solution without stopping the supply operation of the phosphoric acid aqueous solution to the processor 1 and the liquid collection. As a result, uniform processing can be performed with high accuracy while a reduction in processing efficiency of the substrates W is prevented.

[3] Third Embodiment

A substrate processing apparatus according to the present embodiment is a single-substrate processing apparatus that processes substrates one by one. In the substrate processing apparatus, a high temperature phosphoric acid aqueous solution ($H_3PO_4+H_2O$) including siloxane is supplied as a high temperature chemical liquid to a substrate on which a silicone oxide film made of silicon oxide ($SiO_2$) and a silicon nitride film made of silicon nitride ($Si_3N_4$) are formed. In this case, the phosphoric acid aqueous solution includes siloxane, so that an etching rate of the silicone oxide film is reduced. Thus, the silicon nitride film is selectively etched.

Siloxane is a collective term for a compound including a Si—O—Si bond of compounds that are made of dioxide, oxygen and hydrogen, and is represented by a general formula ($H_3SiO$—$H_2SiO)_n$—$SiH_3$).

In the following description, a liquid mixture of ammonia water and hydrogen peroxide water is referred to as SC1. Further, deionized water is referred to as DIW.

(1) Configuration of Substrate Processing Apparatus

Figure 13:
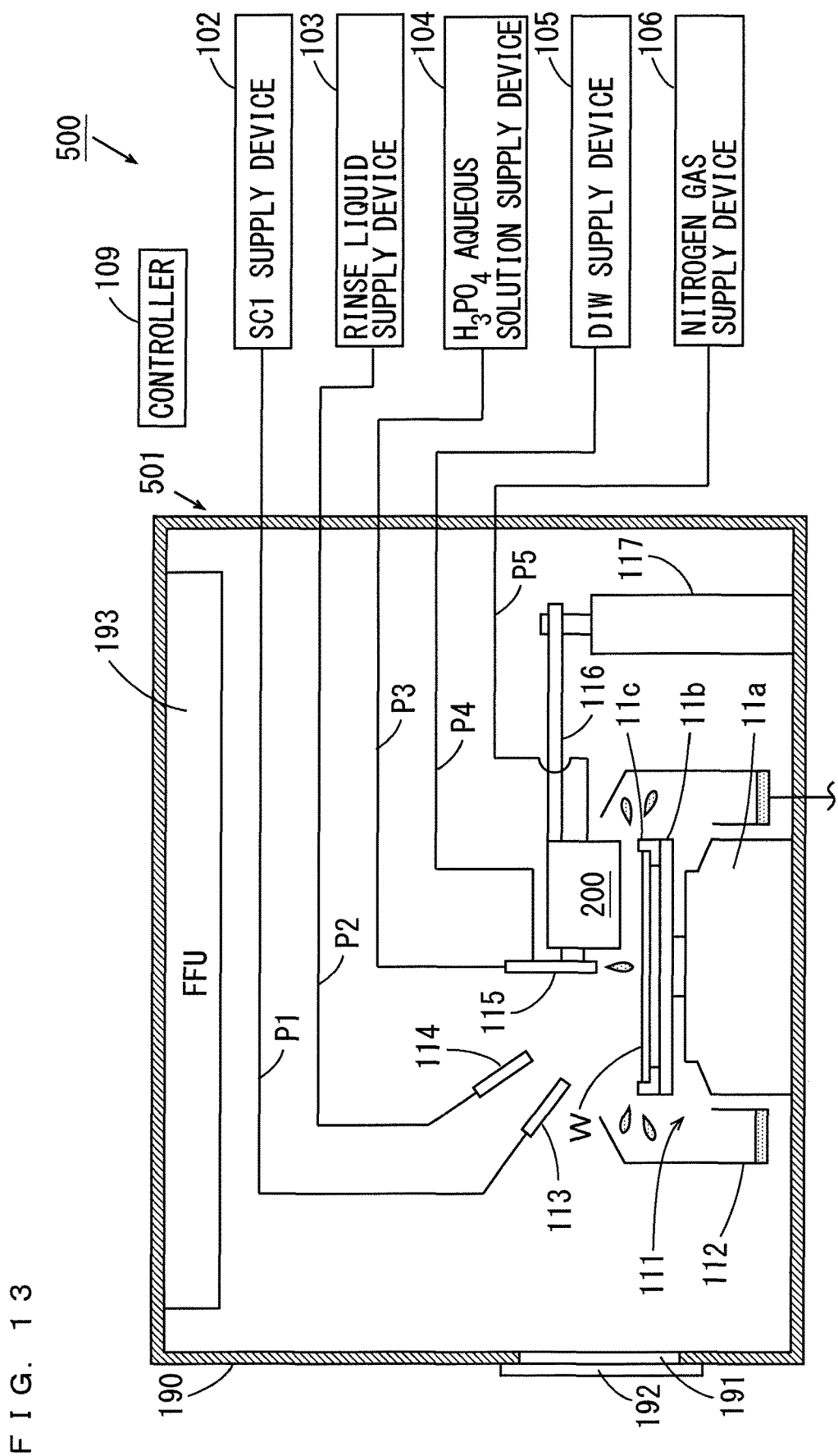
FIG. 13 is a schematic view showing the configuration of a substrate processing apparatus according to a third embodiment.

FIG. 13 is a schematic view showing the configuration of the substrate processing apparatus according to the third embodiment. As shown in FIG. 13, the substrate processing apparatus 500 mainly includes a processor 501, an SC1 supply device 102, a rinse liquid supply device 103, a phosphoric acid aqueous solution supply device 104, a DIW supply device 105, a nitrogen gas supply device 106 and a controller 109.

The processor 501 has a chamber 190. The chamber 190 has four side surface portions, a ceiling portion and a bottom portion. A transport opening 191 for transporting substrates W between outside of the chamber 190 and inside of the chamber 190 is formed at one side surface portion of the chamber 190. A shutter 192 for opening and closing the transport opening 191 is provided at the one side surface portion. Further, a FFU (Fan Filter Unit) 193, which generates a downward air flow in the chamber 190, is provided on the ceiling of the chamber 190.

A spin chuck 111, a cup 112, an SC1 nozzle 113, a rinse nozzle 114, a phosphoric acid nozzle 115, a support arm 116, an arm driving device 117, the chamber 190 and a heating device 200 are provided inside of the chamber 190.

The spin chuck 111 has a spin motor 11a, a spin base 11b and a plurality of chuck pins 11c. The spin motor 11a is provided such that a rotation shaft is parallel to a vertical direction. The spin base 11b has a disc shape, and is attached to an upper end of the rotation shaft of the spin motor 11a in a horizontal attitude. The plurality of chuck pins 11c are provided on an upper surface of the spin base 11b, and holds a peripheral edge of a substrate W. With the plurality of spin chucks 11c holding the substrate W, the spin motor 11a is operated. Thus, the substrate W is rotated about a vertical axis.

While the mechanical spin chuck 111 holding the peripheral edge of the substrate W is used in the present example as described above, the invention is not limited to this. A suction-type spin chuck, which holds a lower surface of the substrate W by suction, may be used instead of the mechanical spin chuck.

The SC1 nozzle 113 and the rinse nozzle 114 are respectively provided to be movable between a processing position above the substrate W held by the spin chuck 111 and a waiting position beside the substrate W.

An SC1 supply system P1 is provided to connect the SC1 supply device 102 to the SC1 nozzle 113. The SC1 nozzle 113 supplies the SC1 supplied from the SC1 supply device 102 to the substrate W rotated by the spin chuck 111.

A rinse liquid supply system P2 is provided to connect the rinse liquid supply device 103 to the rinse nozzle 114. The rinse nozzle 114 supplies a rinse liquid supplied from the rinse liquid supply device 103 to the substrate W rotated by the spin chuck 111. In the present example, the DIW is used as the rinse liquid. As the rinse liquid, carbonated water, ozonated water, magnetic water, regenerated water (hydrogen water) or ionized water, or an organic solvent such as IPA (isopropyl alcohol) can be used instead of the DIW.

Inside of the chamber 190, the arm driving device 117 extending upward from the bottom portion is provided at a position beside the spin chuck 111. The bar-shaped support arm 116 is attached to an upper end of the arm driving device 117 to extend in a horizontal direction. The heating device 200 is attached to a tip end of the support arm 116. Further, the phosphoric acid nozzle 115 is fixed to a portion of the heating device 200.

The arm driving device 117 includes a motor, for example, and rotates the tip end of the support arm 116 about a rotation shaft of the motor. Thus, the phosphoric acid nozzle 115 and the heating device 200 are provided to be movable between the processing position above the substrate W held by the spin chuck 11 and the waiting position beside the substrate W.

The heating device 200 includes a plurality of lamp heaters HT1 to HT4 that generate electromagnetic waves (see FIG. 14), and heats the substrate W and the phosphoric acid aqueous solution supplied to the substrate W by heat of radiation from above the substrate W. The electromagnetic waves being generated from the plurality of lamp heaters HT1 to HT4 mainly include infrared rays and have wavelengths not less than ultraviolet rays and not more than far infrared rays. In the present example, tungsten-halogen lamps are used as the lamp heaters HT1 to HT4. Xenon arc lamps, graphite heaters or the like may be used as the lamp heaters HT1 to HT4 instead of the tungsten-halogen lamps.

A phosphoric acid supply system P3 is provided to connect the phosphoric acid aqueous solution supply device 104 to the phosphoric acid nozzle 115. A DIW supply system P4 is provided to connect the DIW supply device 105 to the phosphoric acid nozzle 115. The phosphoric acid nozzle 115 supplies the phosphoric acid aqueous solution supplied from the phosphoric acid aqueous solution supply device 104 and the DIW supplied from the DIW supply device 105 to the substrate W rotated by the spin chuck 111.

Here, the phosphoric acid aqueous solution being supplied from the phosphoric acid aqueous solution supply device 104 to the phosphoric acid nozzle 115 is heated to a boiling point corresponding to the phosphoric acid concentration (not less than 140° C. and not more than 160° C., for example). Further, siloxane is included in the phosphoric acid aqueous solution supplied to the phosphoric acid nozzle 115.

A nitrogen gas supply system P5 is provided to connect the nitrogen gas supply device 106 to the heating device 200. Thus, a nitrogen gas is supplied from the nitrogen gas supply device 106 to the heating device 200. The function of the nitrogen gas supplied to the heating device 200 will be described below.

Each of the SC1 supply system P1, the rinse liquid supply system P2, the phosphoric acid supply system P3, the DIW supply system P4 and the nitrogen gas supply system P5 is constituted by a pipe into which a valve, a heater, a filter, a pump and the like are inserted.

Further, the cup 112 is provided to surround the spin chuck 111 in the chamber 190. The cup 112 is lowered at a time of carrying of the substrate W into the spin chuck 111 and a time of carrying of the substrate W out from the spin chuck 111, and is lifted at a time of supply of the processing liquid (the SC1, the DIW and the phosphoric acid aqueous solution in the present example) to the substrate W.

At the time of supply of the processing liquid to the rotating substrate W, an upper end of the cup 112 is located at a position further upward than the substrate W. Thus, a processing liquid being shaken off from the substrate W is caught by the cup 112. The processing liquid being caught by the cup 112 is discarded through the discard pipe. Part or all of the processing liquid being caught by the cup 112 may be reutilized.

An exhaust duct (not shown) is coupled to a bottom portion of the cup 112. An atmosphere inside of the cup 112 is discharged to the outside of the chamber 190 via this exhaust duct.

The controller 109 is constituted by a CPU (Central Processing Unit) and a memory, or a microcomputer and the like. A system program is stored in the memory of the controller 109. The controller 109 controls the operation of each constituent element of the substrate processing apparatus 500.

(2) Summary of Operation of Substrate Processing Apparatus

The controller 109 controls the operation of each constituent element of the substrate processing apparatus 500 such that a series of processing described below is performed. First, the substrate W is carried into the chamber 190, and the carried substrate W is held by the spin chuck 111. A silicone oxide film and a silicon nitride film are formed on the main surface (the upper surface in the present example) of the carried substrate W.

Next, the substrate being held by the spin chuck 111 is rotated. Further, the arm driving device 117 of the FIG. 13 is operated, so that the phosphoric acid nozzle 115 is moved to a position above the center of the substrate W held by the spin chuck 111.

The phosphoric acid aqueous solution including siloxane is supplied from the phosphoric acid aqueous solution supply device 114 to the phosphoric acid nozzle 115 at a position with the tip end of the phosphoric acid nozzle 115 being opposite to the center of the substrate W. Thus, a liquid film of the phosphoric acid aqueous solution is formed on the upper surface of the rotating substrate W, and the silicon nitride film of the silicone oxide film and the silicon nitride film on the substrate W is selectively etched.

At this time, with the liquid film of the phosphoric acid aqueous solution being formed, the heating device 200 is opposite to a portion of the upper surface of the substrate W, and electric currents flow in the lamp heaters. Thus, infrared rays are generated from the lamp heaters, and the portion, of the substrate W, being opposite to the heating device 200 and the liquid film of the phosphoric acid aqueous solution are heated by the heat of radiation. In this case, the phosphoric acid aqueous solution being formed on the rotating substrate W is kept at a temperature close to a boiling point corresponding to the phosphoric acid concentration. Thus, an etching rate of the silicon nitride film can be kept high.

Here, when moisture of the phosphoric acid aqueous solution on the substrate W is evaporated, pyrophosphoric acid ($H_4P_2O_7$) is produced in the phosphoric acid aqueous solution. The pyrophosphoric acid etches the silicone oxide film. Therefore, when the phosphoric acid aqueous solution is heated to the boiling point, a ratio of an etching amount of silicon nitride film relative to an etching amount of silicone oxide film (hereinafter referred to as an etching selection ratio) is reduced.

Therefore, in the present example, the DIW is suitably supplied from the DIW supply device 105 to the phosphoric acid nozzle 115 during heating of the liquid film of the phosphoric acid aqueous solution in order to inhibit the silicon oxide film from being etched by the pyrophosphoric acid. Thus, because the same amount of DIW as the evaporated water is supplied to the liquid film of the phosphoric acid aqueous solution, generation of the pyrophosphoric acid is reduced. As a result, the etching selection ratio can be kept high.

Thereafter, the supply of the phosphoric acid aqueous solution and the DIW to the substrate W is stopped as a predetermined time period elapses. Further, the phosphoric acid nozzle 115 and the heating device 200 are moved to the waiting position beside the substrate W. Further, the phosphoric acid aqueous solution on the substrate W is shaken off.

Subsequently, the rinse nozzle 114 is moved to the processing position above the substrate W, and a rinse liquid is supplied to the rotating substrate W. Thus, a remaining phosphoric acid aqueous solution on the substrate W is washed off by the rinse liquid.

Next, the supply of the rinse liquid to the substrate W is stopped, and the rinse nozzle 114 is moved to the waiting position. Further, the SC1 nozzle 113 is moved to the processing position, and the SC1 is supplied to the substrate W. Thereafter, the supply of the SC1 to the substrate W is stopped, and the rinse liquid is supplied to the substrate W. Finally, the supply of the rinse liquid to the substrate W is stopped, and the rinse liquid on the substrate W is shaken off to be dried. The dried and processed substrate W is carried out from the chamber 190.

(3) Configuration of Heating Device

Figure 14:
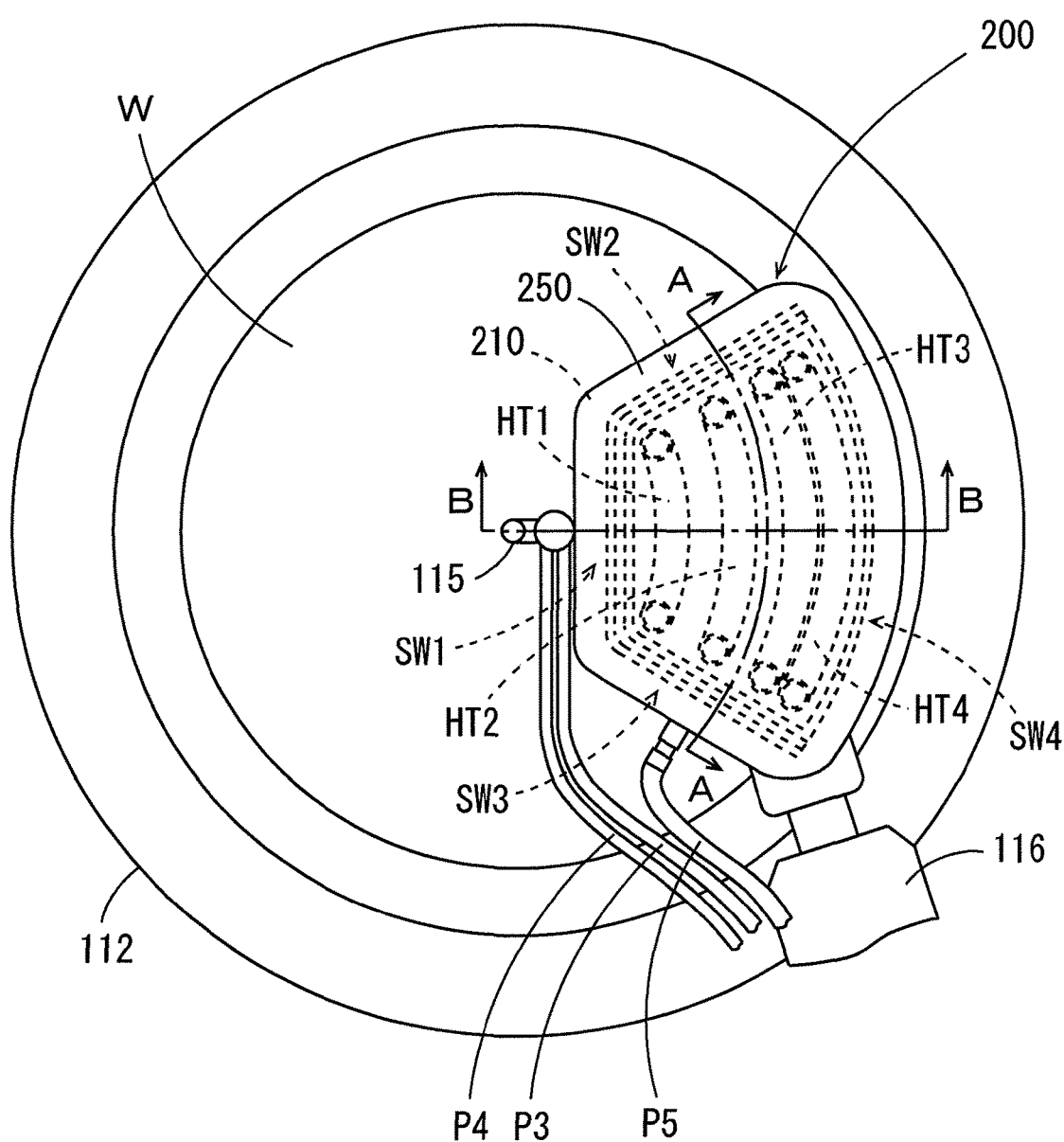
FIG. 14 is a plan view of a heating device of FIG. 13.

FIG. 14 is a plan view of the heating device 200 of FIG. 13. FIG. 14 shows a state of the heating device 200 when the liquid film of the phosphoric acid aqueous solution is heated. As shown in FIG. 14, the heating device 200 includes a casing 210, a cover member 250 and a plurality (four in the present example) of lamp heaters HT1 to HT4. The lamp heaters HT1 to HT4 are stored in the casing 210. The cover member 250 is provided to cover an upper portion of the casing 210. The heating device 200 has a substantially sectorial planer external shape.

Figure 15:
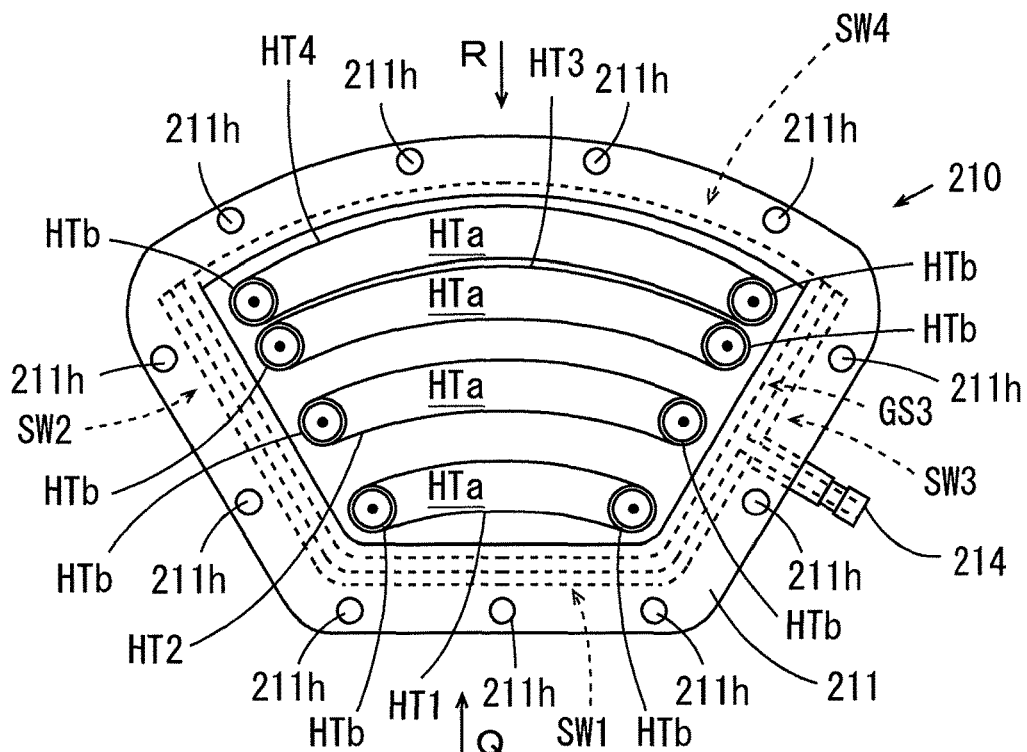
FIG. 15 is a plan view showing a state in which a cover member is removed from a casing of FIG. 14.
Figure 16:
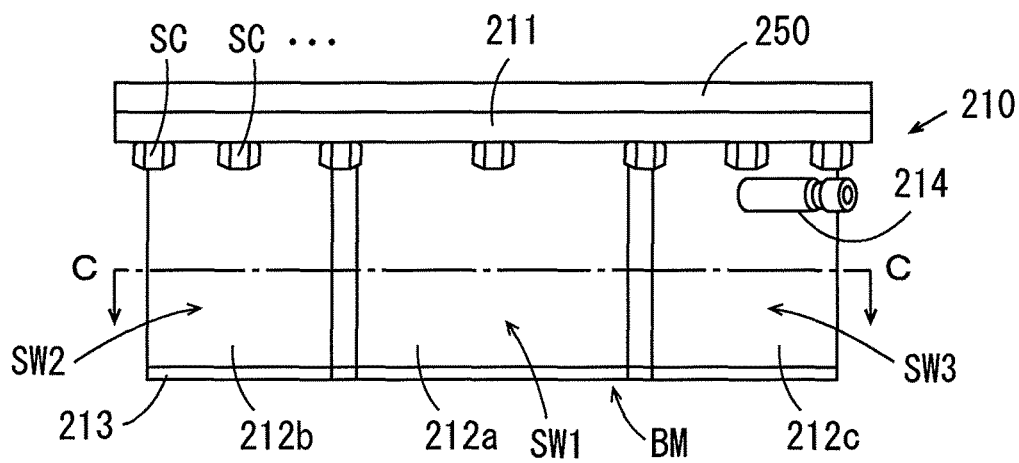
FIG. 16 is a side view of one side of the heating device of FIG. 14 as viewed in a direction of the arrow Q of FIG. 3.
Figure 17:
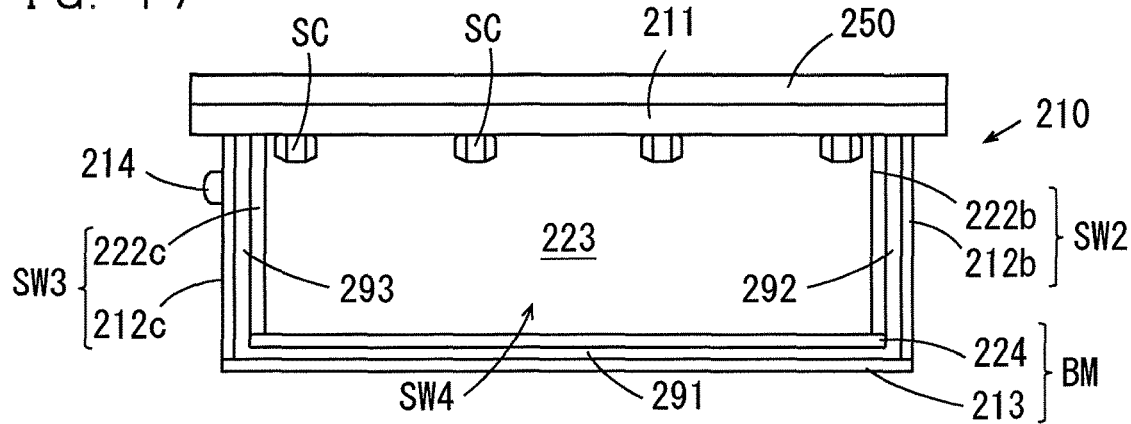
FIG. 17 is a side view of another side of the heating device of FIG. 14 as viewed in a direction of the arrow R of FIG. 3.
Figure 18:
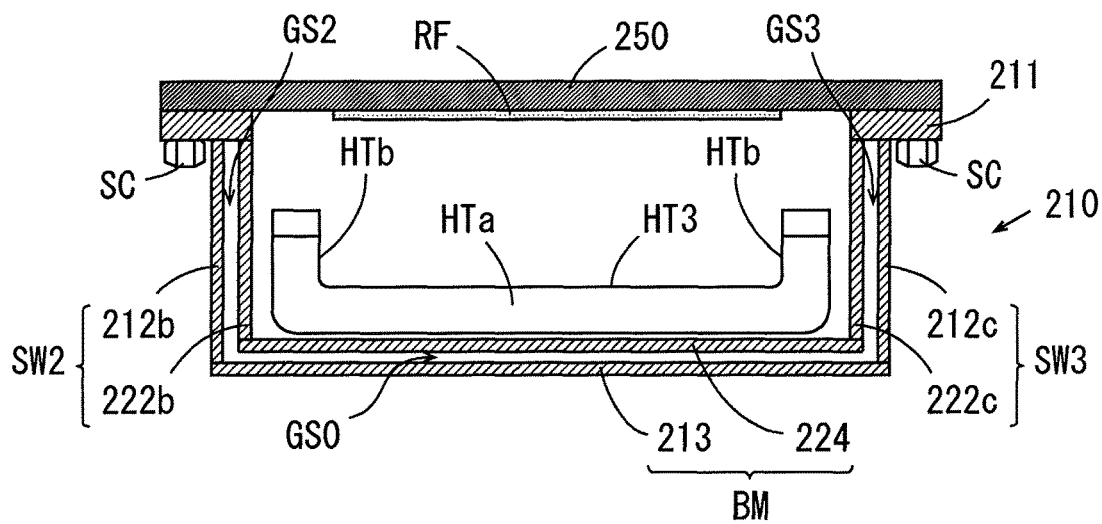
FIG. 18 is a cross sectional view taken along the line A-A of FIG. 14.
Figure 19:
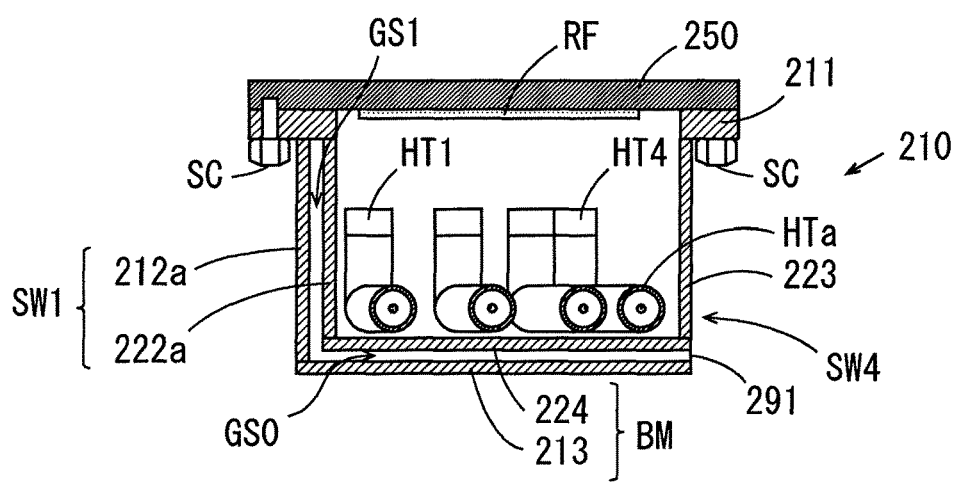
FIG. 19 is a cross sectional view taken along the line B-B of FIG. 14.
Figure 20:
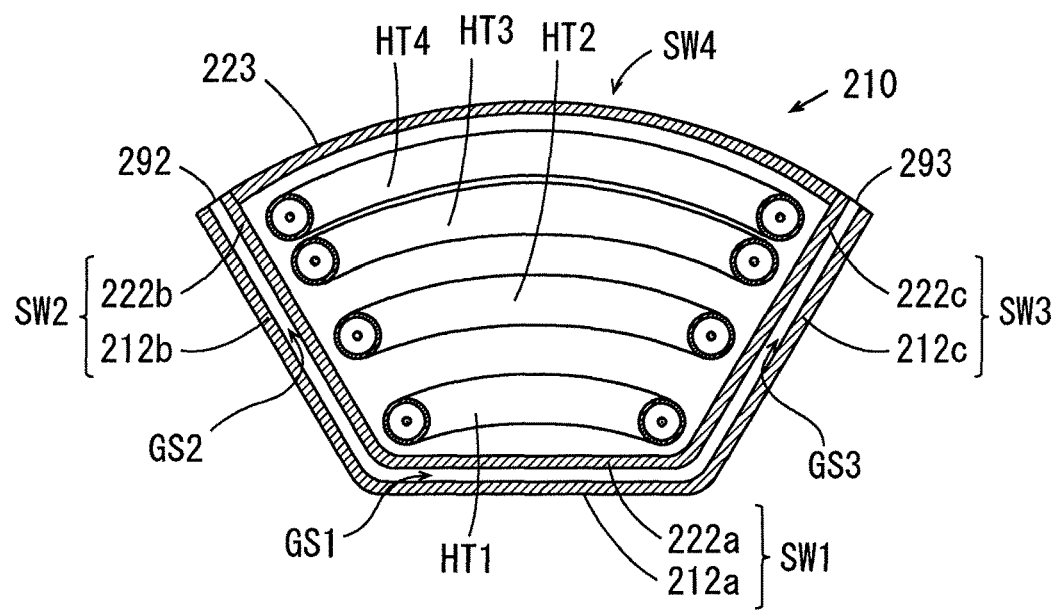
FIG. 20 is a cross sectional view taken along the line C-C of FIG. 16.

FIG. 15 is a plan view showing the cover member 250 being detached from the casing 210 of FIG. 14, FIG. 16 is a side view of one side of the heating device 200 of FIG. 14 as viewed in a direction of the arrow Q of FIG. 15, and FIG. 17 is a side view of the other side of the heating device 200 of FIG. 14 as viewed in the direction of the arrow R of FIG. 15. FIG. 18 is a cross sectional view taken along the line A-A of FIG. 14, FIG. 19 is a cross sectional view taken along the line B-B of FIG. 14 and FIG. 20 is a cross sectional view taken along the line C-C of FIG. 16.

As shown in FIG. 15, the four lamp heaters HT1 to HT4 are arranged in one direction in the casing 210. Each lamp heater HT1 to HT4 has the configuration in which a filament is arranged in a silica pipe. Further, each lamp heater HT1 to HT4 has a curved portion HTa being formed in a circular arc shape and a linear portion HTb extending upward from both ends of the curved portion THa (see FIG. 18, described below). A terminal is provided at the upper end of each linear portion HTb.

Wirings (not shown) are respectively connected to two terminals of each lamp heater HT1 to HT4. The wirings being connected to each lamp heater HT1 to HT4 are drawn out to the outside of the casing 210 via through holes (not shown) formed in the cover member 250, and are connected to a power device. Electric currents flow in the lamp heaters HT1 to HT4 through each wiring, so that the infrared rays are mainly generated from the curved portions HTa.

Hereinafter, the four lamp heaters HT1 to HT4 are respectively referred to as a first lamp heater HT1, a second lamp heater HT2, a third lamp heater HT3 and a fourth lamp heater HT4.

The first lamp heater HT1, the second lamp heater HT2, the third lamp heater HT3 and the fourth lamp heater HT4 are arranged in this order from a rotational center of the substrate W in an outward radial direction of the substrate W.

With the heating device 200 being located at the processing position, the heating device 200 is supported by the support arm 116 such that the first lamp heater HT1 being located at an innermost position is arranged at a position close to the rotational center of the substrate W and the fourth lamp heater HT4 being located at an outermost position is arranged at a position slightly leaned towards the rotational center of the substrate W than a position right over the outer periphery of the substrate W. Therefore, the first to fourth lamp heaters HT1 to HT4 can heat a sectorial-shape region extending from the center to the outer periphery of the substrate W all at once.

Further, a heating profile of the first to fourth lamp heaters HT1 to HT4 on the upper surface of the substrate W are set such that a temperature of the liquid film of the phosphoric acid aqueous solution on the substrate W can be increased at a constant speed in a radial direction of the substrate W. For example, it is difficult to increase the temperature of the region of the outer periphery of the substrate W and its vicinity due to being cooled by an air stream caused by the rotation of the substrate W. In the present embodiment, in order to compensate this, the third lamp heater HT3 is located at a position slightly leaned towards the outer periphery of the substrate as compared to a case in which the first to fourth lamp heaters HT1 to HT4 are arranged at equal intervals in the radial direction of the substrate W. That is, the distance between the third lamp heater HT3 and the fourth lamp heater HT4 is set smaller than the distance between the first lamp heater HT1 and the second lamp heater HT2. Thus, the region of the outer periphery of the substrate W and its vicinity can be heated with a relatively larger amount of heat than a region of the rotational center of the substrate W.

Further, curvature of the first to fourth lamp heaters HT1 to HT4 when seen in top view is substantially equal to curvature of the outer periphery of the substrate W.

As described below, the etching of the substrate W is performed with the heating device 200 being fixed at the processing position while the substrate W is rotated. The first to fourth lamp heaters HT1 to HT4 of the heating device 200 can heat the sectorial-shape region extending from the center to the outer periphery of the substrate W all at once. Further, the heating profile of the first to fourth lamp heaters HT1 to HT4 are set such that the temperature of the liquid film of the phosphoric acid aqueous solution is increased at the constant speed in the radial direction of the substrate W. Further, the curvature of the first to fourth lamp heaters HT1 to HT4 is substantially equal to the curvature of the outer periphery of the substrate W. Therefore, the first to fourth lamp heaters HT1 to HT4 can increase the temperature of the liquid film of the phosphoric acid aqueous solution at a constant speed not only in the radial direction but also in a circumferential direction of the substrate W. Thus, in-plane uniformity of the etching rate of the substrate W can be increased.

Infrared rays being mainly generated from the first to fourth lamp heaters HT1 to HT4 of the present example include near infrared rays, intermediate infrared rays and far infrared rays, and have wavelengths of not less than about 750 nm and not more than about 1000 nm.

A flange plate 211 made of a silica glass is provided at an upper end of the casing 210. A plurality of through holes 211h are formed at substantially constant intervals in the flange plate 211.

A plurality of screw holes corresponding to the plurality of through holes 211h of the flange plate 211 are formed in the cover member 250 of FIG. 14. A plurality of screws SC are fitted into the plurality of screw holes of the cover member 250 through the plurality of through holes 211h of the flange plate 211. Thus, the cover member 250 is attached to the casing 210 via the flange plate 211.

The cover member 250 is made of PTFE (polytetrafluoroethylene), for example. A resin material, such as PVC (polyvinyl chloride), PPS (polyphenylenesulfide), PFA (Tetrafluoroethylene Perfluoroalkylvinylether Copolymer) or the like besides the PTFE can be used as a material for the cover member 250.

As shown in FIGS. 18 and 19, a reflection plate RF for reflecting the infrared rays, which is emitted upward from the first to fourth lamp heaters HT1 to HT4, downward is provided at a center portion of a lower surface of the cover member 250.

As shown in FIG. 20, the casing 210 has a first sidewall portion SW1, a second sidewall portion SW2, a third sidewall portion SW3 and a fourth sidewall portion SW4. The first sidewall portion SW1 is opposite to the fourth sidewall portion SW4. The second sidewall portion SW2 and the third sidewall portion SW3 are provided to respectively connect both ends of the first sidewall portion SW1 to both ends of the fourth sidewall portion SW4.

The first sidewall portion SW1 is constituted by a plate-shape first inner member 222a and a plate-shape first outer member 212a located outside of the first inner member 222a. A first side passage GS1 is formed between the first inner member 222a and the first outer member 212a.

The second sidewall portion SW2 is constituted by a plate-shape second inner member 222b and a plate-shape second outer member 212b located outside of the second inner member 222b. A second side passage GS2 is formed to communicate with the first side passage GS1, and a discharge opening 292 extending in the vertical direction is provided to extend along the one lateral side of the fourth sidewall portion SW4, between the second inner member 222b and the second outward member 212b.

The third sidewall portion SW3 is constituted by a plate-shape third inner member 222c and a plate-shape third outer member 212c located outside of the third inner member 222c. A third side passage GS3 is formed to communicate with the first side passage GS1, and a discharge opening 293 extending in the vertical direction is provided to extend along the other lateral side of the fourth sidewall portion SW4, between the third inner member 222c and the third outer member 212c.

The fourth sidewall portion SW4 is constituted by a plate-shape member 223. The plate-shape member 223 has a rectangular elongated plate-shape that is curved in a circular arc shape. It is desirable that curvature of the plate-shape member 223 coincides with the curvature of the outer periphery of the substrate W.

As shown in FIG. 19, the first sidewall portion SW1 and the fourth sidewall portion SW4 are joined to the lower surface of the flange plate 211 by welding. Further, as shown in FIG. 18, the second sidewall portion SW2 and the third sidewall portion SW3 are joined to the lower surface of the flange plate 211 by welding.

The first and third inner members 222a to 222c, the first to third outer members 212a to 212c and the plate-shape member 223 are respectively made of silica glasses that transmit infrared rays. The first to third inner members 222a to 222c may be integrally formed with one another or separately formed from one another. Further, the first to third outer members 212a to 212c may be integrally formed with one another or separately formed from one another.

As shown in FIGS. 18 and 19, the casing 210 further has a bottom portion BM. The bottom portion BM is constituted by a first plate-shape member 224 and a second plate-shape member 213 that is located below the first plate-shape member 224. The first plate-shape member 224 and the second plate-shape member 213 are made of silica glasses that transmits infrared rays. The first plate-shape member 224 is joined to lower ends of the first to third inner members 222a to 222c and a lower end of the plate-shape member 223 by welding. The second plate-shape member 213 is joined to lower ends of the first to third outer members 212a to 212c by welding.

A gas passage GS0 communicating with the above-mentioned first side passage GS1, the second side passage GS2 and the third side passage GS3 is formed, and a discharge opening 291 extending in the horizontal direction along the lower side of the fourth sidewall portion SW4 is provided, between the first plate-shape member 224 and the second plate-shape member 213.

As shown in FIG. 17, the discharge openings 292, 293, 291 extend along both lateral sides and a lower side of the fourth sidewall portion SW4.

As shown in FIGS. 15 and 16, a gas introduction pipe 214 is joined to a portion in the vicinity of the upper end of the third outer member 212c by welding. The gas introduction pipe 214 is made of a silica glass, and is provided to communicate with the third side passage GS3 between the third outer member 212c and the third inner member 222c, and a space outside of the casing 210.

As shown in FIG. 14, the heating device 200 is supported by the support arm 116 of FIG. 13 to be still with the fourth sidewall portion SW4 being located substantially right over the outer periphery of the substrate W and the first sidewall portion SW1 being located in the vicinity of the center of the substrate W at a time of heating of the phosphoric acid aqueous solution on the rotating substrate W. At this time, the first plate-shape member 224 and the second plate-shape member 213, which constitute the bottom portion BM of FIG. 17, are arranged to be parallel to the upper surface of the substrate W. The second sidewall portion SW2 and the third sidewall portion SW3 extend in the radial direction of the substrate W. Further, the discharge openings 292, 293, 291 of FIG. 17 are located substantially right over the outer periphery of the substrate W. The discharge openings 292, 293, 291 may be located above positions further outward than the outer periphery of the substrate W. Either way, the discharge openings 292, 293, 291 are arranged at positions at which the nitrogen gas can be discharged in the outward radial direction of the substrate W from a position further outward in the outward radial direction of the substrate W than the outer periphery of the substrate W, that is, an outer periphery of the liquid film of the phosphoric acid aqueous solution formed on the upper surface of the substrate W.

(4) Function and Effects of Nitrogen Gas Supplied to Heating Device

In the heating device 200 having the above-mentioned configuration, the nitrogen gas supply system P5 of FIG. 13 is connected to the gas introduction pipe 214 of FIGS. 15 and 16. A room-temperature nitrogen gas is supplied from the nitrogen gas supply device 106 of FIG. 13 to the third side passage GS3 in the casing 210 through the nitrogen gas supply system P5 and the gas introduction pipe 214.

Figure 21:
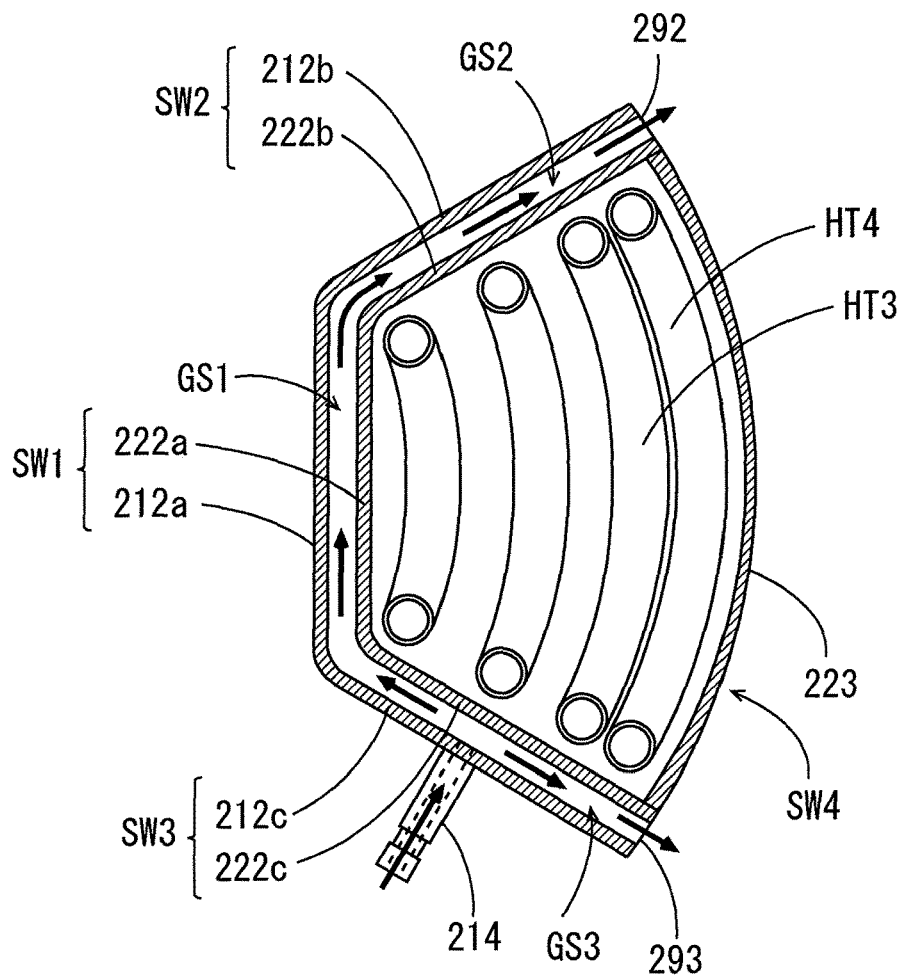
FIG. 21 is a horizontal cross sectional view showing a flow of a nitrogen gas in the heating device.
Figure 22:
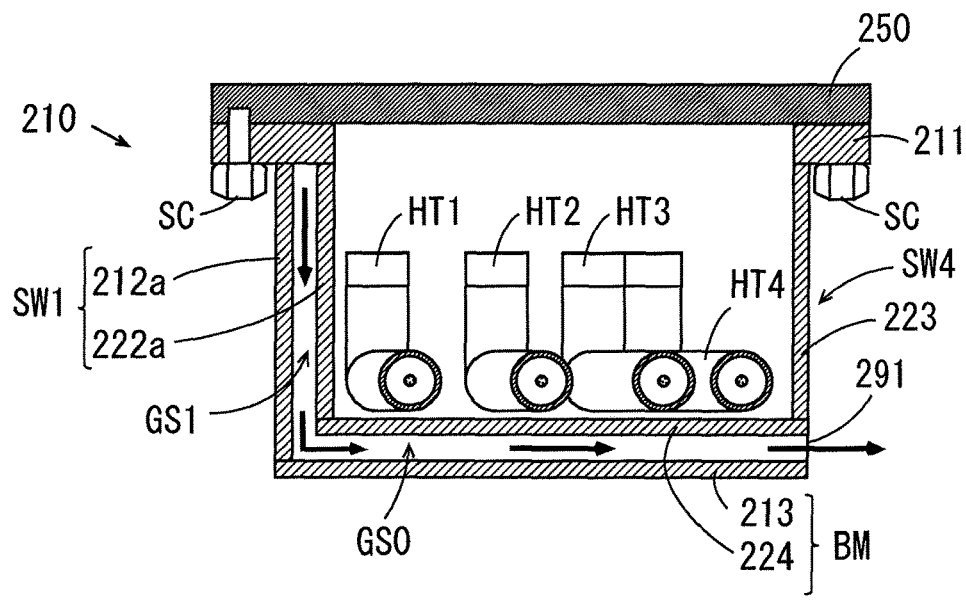
FIG. 22 is a vertical cross sectional view showing the flow of the nitrogen gas in the heating device.

FIG. 21 is a horizontal cross sectional view showing a flow of the nitrogen gas in the heating device 200, and FIG. 22 is a vertical cross sectional view showing the flow of the nitrogen gas in the heating device 200.

The room-temperature nitrogen gas supplied from the gas introduction pipe 214 to the third side passage GS3 flows in the third side passage GS3, the first side passage GS1, the second side passage GS2 and the gas passage GS0 as indicated by the thick arrows in FIGS. 21 and 22, and is discharged from the discharge openings 291, 292, 293.

Figure 23:
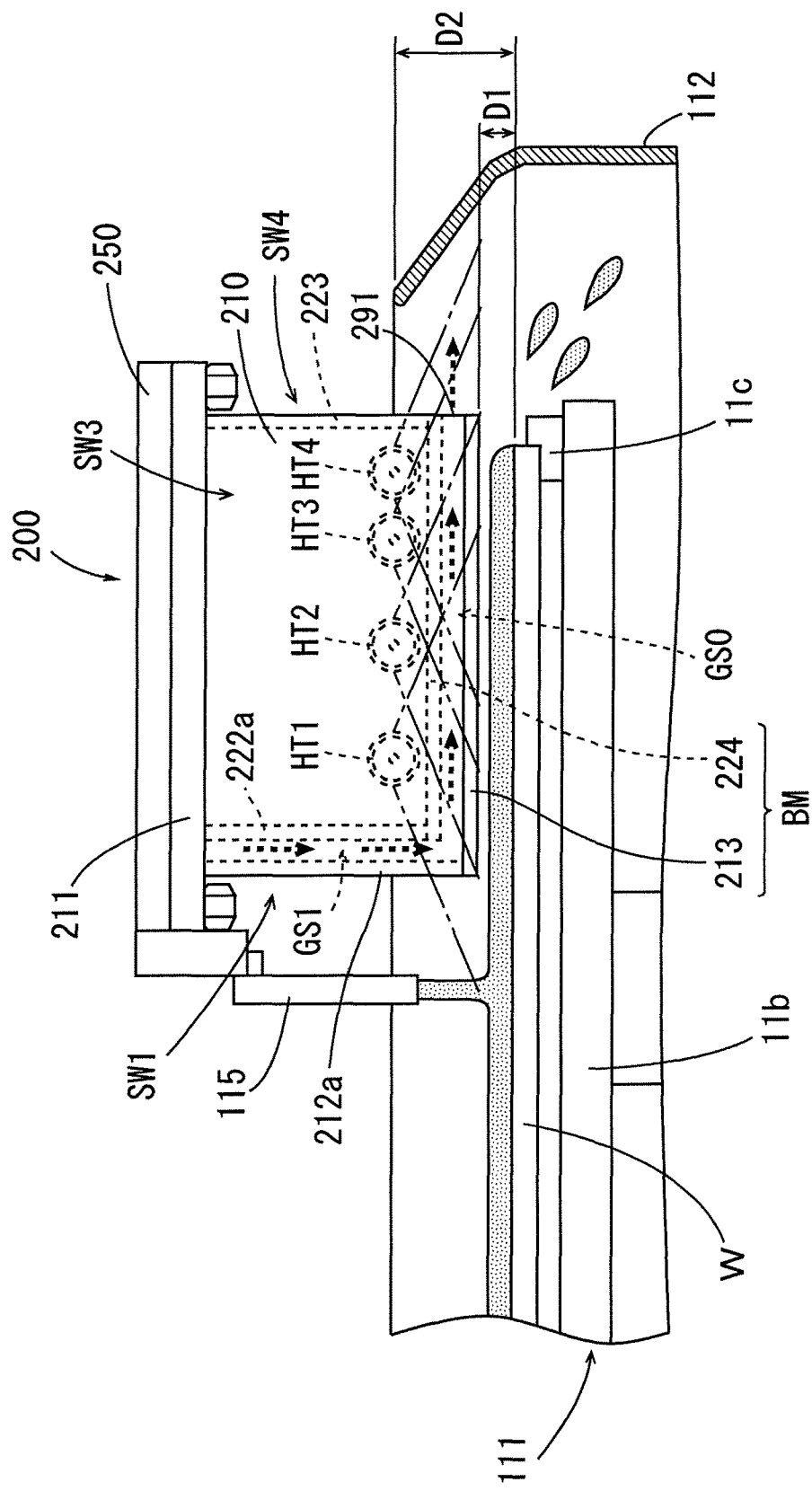
FIG. 23 is a side view of the heating device when a liquid film of a phosphoric acid aqueous solution is heated.

FIG. 23 is a side view of the heating device 200 when the liquid film of the phosphoric acid aqueous solution is heated. As shown in FIG. 23, the phosphoric acid aqueous solution is supplied from the phosphoric acid nozzle 115 to the substrate W held by the spin chuck 111, and the liquid film of the phosphoric acid aqueous solution is formed on the rotating substrate W.

At this time, the number of rotations of the substrate W is kept about 1 rpm to 500 rpm, for example.

Further, the distance D1 between a lower surface of the heating device 200 (a lower surface of the second plate-shape member 213) and the upper surface of the substrate W held by the spin chuck 111 is set to 5 mm, for example. Further, the distance D2 between the upper end of the cup 112 and the upper surface of the substrate W held by the spin chuck 111 is set to 22 mm, for example.

In this state, electric currents respectively flow in the first to fourth lamp heaters HT1 to HT4 of the heating device 200, so that the infrared rays are generated from the first to fourth lamp heaters HT1 to HT4. Part of the generated infrared rays are permeated through the first plate-shape member 224 and the second plate-shape member 213, and the liquid film of the phosphoric acid aqueous solution on the substrate W is irradiated with the infrared rays. Further, the rest of the generated infrared rays are permeated through the first to third inner members 222a to 222c (see FIG. 21) and the first to third outer members 212a to 212c (see FIG. 21), and the liquid film of the phosphoric acid aqueous solution on the substrate W is irradiated with the infrared rays. Thus, the liquid film of the phosphoric acid aqueous solution is heated.

In this case, the temperatures of the first plate-shape member 224 and the first to third inner members 222a to 222c are also increased by the heat of radiation from the first to fourth lamp heaters HT1 to HT4 and the heat that is conducted from the first to fourth lamp heaters HT1 to HT4. Further, the temperatures of the second plate-shape member 213 and the first to third outer members 212a to 212c are increased by the heat of radiation from the first to fourth lamp heaters HT1 to HT4 and the like.

The heating device 200 is close to the upper surface of the substrate W, so that splashes of the phosphoric acid aqueous solution may splash from the liquid film of the phosphoric acid aqueous solution and the like and adhere to the second plate-shape member 213 and the first to third outer members 212a to 212c. Further, a lower surface of the second plate-shape member 213 may directly come into contact with the phosphoric acid aqueous solution depending on the size of the distance D1 of FIG. 23 and the thickness of the liquid film of the phosphoric acid aqueous solution.

When the high temperature phosphoric aqueous solution adheres to the second plate-shape member 213 and the first to third outer members 212a to 212c, corrosion reaction or the like may occur between the silica glass in the member and the phosphoric acid aqueous solution, so that fogging occurs in the surfaces of the second plate-shape member 213 and the first to third outer members 212a to 212c.

In the heating device 200 according to the present embodiment, as indicated by the thick dotted arrows in FIG. 23, the room-temperature nitrogen gas flows in the first to third side passages GS1 to GS3 (see FIG. 21) and the gas passage GS0, and is discharged from the discharge openings 291, 292, 293 (see FIGS. 21 and 22).

The room-temperature nitrogen gas flows, so that the first to third side passages GS1 to GS3 (see FIG. 21) and the gas passage GS0 are cooled. Thus, increases in temperatures of the first plate-shape member 224, the first to third inner members 222a to 222c, the second plate-shape member 213 and the first to third outer members 212a to 212c are inhibited. Thus, even if splashes of the phosphoric acid aqueous solution adhere to the second plate-shape member 214 and the first to third outer members 212a to 212c, each member does not react with the phosphoric acid aqueous solution, so that fogging does not occur in the surface.

In this manner, fogging does not occur in the first plate-shape member 224, the first to third inner members 222a to 222c, the second plate-shape member 213 and the first to third outer members 212a to 212c, so that transparency is maintained. Therefore, the infrared rays being generated from the first to fourth lamp heaters HT1 to HT4 are permeated without being prevented by these members, and the liquid film of the phosphoric acid aqueous solution on the substrate W is uniformly irradiated with the infrared rays.

Further, the discharge openings 291 to 293 of the heating device 200 are located at positions further outward than the outer periphery of the substrate W (and the liquid film of the phosphoric acid aqueous solution formed on the upper surface) in the outward radial direction of the substrate W when seen in top view. Therefore, the nitrogen gas discharged from the discharge openings 291 to 293 is discharged to the outside of the chamber 190 from a duct of the bottom portion of the cup 112 (not shown) without passing through a space above the liquid film of the phosphoric acid aqueous solution. Therefore, the nitrogen gas being discharged from the discharge openings 291 to 293 is prevented from locally cooling the liquid film of the phosphoric acid aqueous solution.

An etching rate of the silicone oxide film and the silicon nitride film on the substrate W by the phosphoric acid aqueous solution is largely depended on a temperature of the phosphoric acid aqueous solution. For example, the etching rate is high at a position at which a liquid temperature of the phosphoric acid aqueous solution is high, and the etching rate is low at another position at which the liquid temperature of the phosphoric acid aqueous solution is low. Therefore, when the liquid film of the phosphoric acid aqueous solution on the substrate W is locally cooled, in-plane uniformity of the etching rate of the substrate W by the phosphoric acid aqueous solution may be impaired.

In the present heating device 200, the nitrogen gas being discharged from the discharge openings 291, 292, 293 is prevented from locally cooling the phosphoric acid aqueous solution on the substrate W. Therefore, the in-plane uniformity of the etching rate is not impaired due to the nitrogen gas discharged from the heating device 200. As a result, uniform etching processing of the silicone oxide film and the silicon nitride film by the heated phosphoric acid aqueous solution becomes possible.

In the present embodiment, at least one of a temperature and a flow rate of the nitrogen gas supplied to the heating device 200 is preferably adjusted such that the temperatures of the second plate-shape member 213 and the first to third outer members 212a to 212c are kept at not less than the room temperature (about 23° C.) and not more than 100° C., for example. In this case, even when the phosphoric acid aqueous solution adheres to the second plate-shape member 213 and the first to third outer members 212a to 212c, fogging is prevented from being generated in the surfaces of the second plate-shape member 213 and the first to third outer members 212a to 212c.

In the present embodiment, with the heating device 200 being supported at the processing position above the substrate W, the first to fourth lamp heaters HT1 to HT4 are arranged in the radial direction of the substrate W such that the region from the center to the outer periphery in the radial direction of the substrate W is irradiated with infrared rays. Thus, the region from the center to the outer periphery in the radial direction of the substrate W is simultaneously irradiated with infrared rays at the time of heating of the phosphoric acid aqueous solution. Therefore, the entire phosphoric acid aqueous solution on the substrate W is uniformly heated by the rotation of the substrate W.

Further, each of the first to fourth lamp heaters HT1 to HT4 is formed in a circular arc shape to extend along the outer periphery of the substrate W. Thus, the phosphoric acid aqueous solution on the substrate W is uniformly irradiated with infrared rays in the circumferential direction of the substrate W. Thus, the phosphoric acid aqueous solution on the substrate W is uniformly heated in the circumferential direction.

[4] Other Embodiments (1) While the phosphoric acid aqueous solution being a chemical liquid is used as the processing liquid and the phosphoric acid concentration and silicon concentration of the phosphoric acid aqueous solution are adjusted in the first and second embodiments, the invention is not limited to this. Another chemical liquid, which requires the concentration adjustment, may be used according to the content of processing of the substrate W.

As another chemical liquid, buffered hydrogen fluoride (BHF), diluted hydrofluoric acid (DHF), hydrofluoric acid (HF), hydrochloric acid, sulfuric acid, nitric acid, acetic acid, oxalic acid, an aqueous solution such as ammonia water or a liquid mixture of these may be used, for example. Further, as the liquid mixture, a liquid mixture (SPM) of high temperature sulfuric acid ($H_2SO_4$) and hydrogen peroxide ($H_2O_2$), a mixed solution (SC1) of ammonia and hydrogen peroxide water, or a liquid mixture (SC2) of hydrochloric acid (HCl) and hydrogen peroxide water can be used, for example.

Even when these chemical liquids are used, the concentration of the specific component in the chemical liquid is adjusted in the tank in which the liquid collection is not performed. Thus, accurate concentration adjustment of the chemical liquid becomes possible.

(2) While the first, second and third tanks 5, 6, 7 are used as tanks for storing the phosphoric acid aqueous solution in the above-mentioned processor 1 in the first and second embodiments, the invention is not limited to this. The larger number of tanks may be provided in the substrate processing apparatus 100.

(3) In the above-mentioned processor 1, the processing liquid nozzle 3 supplying the phosphoric acid aqueous solution to the substrate W is provided in the first and second embodiments. Additionally, in the processor 1, a rinse liquid nozzle supplying a rinse liquid to the substrate W may be provided or another processing liquid nozzle supplying another chemical liquid other than the phosphoric acid aqueous solution to the substrate W may be provided. This varies the contents of processing of the substrate W in the processor 1.

As the rinse liquid, pure water, carbonated water, ozonated water, magnetic water, regenerated water (hydrogen water) or ionized water, or an organic solvent such as IPA (isopropyl alcohol) can be used.

(4) While the silicon concentration of the phosphoric acid aqueous solution being used for the processing of the substrate W is adjusted to the reference silicon concentration in the silicon concentration adjustment in the first and second embodiments, the invention is not limited to this. The silicon concentration of the phosphoric acid aqueous solution may be adjusted within a predetermined range including the reference silicon concentration in the silicon concentration adjustment. In this case, it is possible to shorten a time period required for the silicon concentration adjustment by enlarging the adjustment range as necessary.

(5) In the substrate processing apparatus 100 according to the first and second embodiments, the heating device 200 according to the third embodiment may be used as the heating device 4. In this case, the SC1 supply device 102, the rinse liquid supply device 103 and the nitrogen gas supply device 106 of FIG. 13 are further provided in the substrate processing apparatus 100 according to the first and second embodiments. Thus, in the substrate processing apparatus 100 according to the first and second embodiments, similar processing to the third embodiment can be performed. As a result, the phosphoric acid aqueous solution on the substrate W is uniformly heated, and uniform and efficient processing becomes possible.

(6) In the third embodiment, with the heating device 200 being at the processing position, the discharge openings 291 to 293 are located at positions further outward than the outer periphery of the substrate W (and the liquid film of the phosphoric acid aqueous solution formed on the upper surface) in the outward radial direction of the substrate W when seen in top view. However, the discharge openings 291 to 293 may be located at positions slightly further inward than the outer periphery of the substrate W in the inward radial direction of the substrate W.

(7) While a silica glass transmitting infrared rays is used as the material that constitutes the first to fourth sidewall portions SW1 to SW4 and the bottom portion BM of the casing 210 in the third embodiment, the invention is not limited to this. As the material that constitutes the first to fourth sidewall portions SW1 to SW4 and the bottom portion BM, an inorganic matter (a sapphire glass and the like) such as another glass that transmits infrared rays, or resin may be used instead of the silica glass.

(8) While the nitrogen gas is used as the gas that is supplied to the heating device 200 in the third embodiment, the invention is not limited to this. Another inert gas such as argon may be used as the gas supplied to the heating device 200 instead of the nitrogen gas.

(9) The heating device 200 according to the third embodiment is used to heat the phosphoric acid aqueous solution. However, the invention is not limited to this. The heating device 200 may be used to heat another chemical liquid that requires processing at a high temperature. There are a liquid mixture (SPM) of sulfuric acid ($H_2SO_4$), hydrogen peroxide ($H_2O_2$) and the like as another chemical liquid.

[5] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

(1) In the first and second embodiments, the substrate processing apparatus 100 is an example of a substrate processing apparatus, the processing liquid nozzle 3 is an example of a processing liquid nozzle, the processor 1 is an example of a processing unit, the first tank 5 is an example of a supply tank, the second tank 6 is an example of a collection tank, the third tank 7 is an example of an adjustment tank, and the first, second and third tanks 5, 6, 7 are examples of a plurality of tanks.

Further, the supply operation of the phosphoric acid aqueous solution to the processing liquid nozzle 3 is an example of a supply operation, the liquid collection operation is an example of a collection operation, the silicon concentration adjustment including the adjustment of the phosphoric acid concentration is an example of an adjustment operation, the first supply pipes 10, the pumps 15, 24, 34, the valves 12, 17, 21, 26, 31, 36, 41, 42, 43, 51, 52, 53, the circulation pipes 16, 25, 35, the second supply pipe 20, the third supply pipe 40 and the collection pipe 50 are examples of a path changing mechanism.

Further, the first, second and third tanks 5, 6, 7 are respectively examples of first, second and third tanks, the first supply pipe 10, the valve 12 and the pump 15 of FIG. 1 are examples of a first processing liquid supply system, the collection pipe 50, the valves 51, 52 of FIG. 1 are examples of a processing liquid collection system of claim 3, the new liquid supply device 8 is an example of a concentration adjustment device, the second supply pipe 20, the valves 21, 31 and the pumps 24, 34 are examples of a second processing liquid supply system, the first supply pipe 10, the valves 12, 21, 31, the pumps 15, 24, 34 and the second supply pipe 20 of FIG. 11 are examples of a processing liquid supply system, and the collection pipe 50 and the valves 51, 52, 53 of FIG. 11 are examples of a processing liquid collection system of claim 5. Further, the silicon nitride film is an example of a first film, and the silicone oxide film is an example of a second film.

(2) In the third embodiment, the substrate processing apparatus 500 is an example of a substrate processing apparatus, the substrate W is an example of a substrate, the spin chuck 111 is an example of a substrate holding device, the phosphoric acid aqueous solution supply device 104 and the phosphoric acid supply system P3 are examples of a chemical liquid supply system, the heating device 200 is an example of a heating device, the nitrogen gas supply device 106 and the nitrogen gas supply system P5 are examples of a gas supply system, the first to fourth lamp heaters HT1 to HT4 are examples of an infrared ray generator, the first plate-shape member 224 is an example of a first plate-shape member, the second plate-shape member 213 is an example of a second plate-shape member, the gas passage GS0 is an example of a gas passage and the discharge opening 291 is an example of a first discharge opening.

Further, the casing 210 is an example of a casing, the bottom portion BM is an example of a bottom portion, the first sidewall portion SW1 is an example of a first sidewall portion, the second sidewall portion SW2 is an example of a second sidewall portion, the third sidewall portion SW3 is an example of a third sidewall portion, the fourth sidewall portion SW4 is an example of a fourth sidewall portion, the first inner member 222a is an example of a first inner member, the first outer member 212a is an example of a first outer member, the first side passage GS1 is an example of a first side passage, the second inner member 222b is an example of a second inner member, the second outer member 212b is an example of a second outer member, the second side passage GS2 is an example of a second side passage, the discharge opening 292 is an example of a second discharge opening, the third inner member 222c is an example of a third inner member, the third outer member 212c is an example of a third outer member, the third side passage GS3 is an example of a third side passage, and the discharge opening 293 is an example of a third discharge opening.

(3) As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing of a substrate.

We claim:

1. A substrate processing method in a substrate processing apparatus including a processing unit having a processing liquid nozzle that supplies a processing liquid to a substrate, a first tank, a second tank, a third tank, and a path switcher that switches a path of the processing liquid among the processing unit, the first tank, the second tank, and the third tank, the method comprising:
   performing a supply operation of supplying the processing liquid from the first tank to the processing liquid nozzle of the processing unit;
   performing a collection operation of collecting the processing liquid from the processing unit to the second tank in parallel with the supply operation;
   performing an adjustment operation of adjusting concentration of the processing liquid stored in the third tank in parallel with the supply operation and the collection operation by the second tank;
   supplying the adjusted processing liquid from the third tank to the first tank in parallel with the supply operation after the adjustment operation by the third tank is finished;
   performing a collection operation of collecting the processing liquid from the processing unit to the third tank in parallel with the supply operation after the adjusted processing liquid is supplied from the third tank to the first tank;
   performing an adjustment operation of adjusting concentration of the processing liquid stored in the second tank in parallel with the supply operation and the collection operation by the third tank;
   supplying the adjusted processing liquid from the second tank to the first tank in parallel with the supply operation after the adjustment operation by the second tank is finished;
   switching the path switcher such that the collection operation by the second tank and the collection operation by the third tank are performed alternately; and
   switching the path switcher such that the adjustment operation by the third tank and the supply operation to the first tank, and the adjustment operation by the second tank and the supply operation to the first tank are performed alternately.

2. The substrate processing method according to claim 1, wherein
   the adjustment operation by the third tank includes a first new liquid addition operation of adding a new processing liquid to the third tank, and
   the adjustment operation by the second tank includes a second new liquid addition operation of adding a new processing liquid to the second tank.

3. The substrate processing method according to claim 2, wherein
   the first new liquid addition operation includes supplying a processing liquid produced by a new liquid supply device to the third tank, and
   the second new liquid addition operation includes supplying the processing liquid produced by the new liquid supply device to the second tank.

4. The substrate processing method according to claim 3, further comprising:
   detecting the concentration of the processing liquid in the third tank by a first concentration meter; and
   detecting the concentration of the processing liquid in the second tank by a second concentration meter,
   wherein the first new liquid supply operation includes producing a processing liquid having a concentration higher than a reference concentration by the new liquid supply device to supply the produced processing liquid to the third tank when the concentration detected by the first concentration meter is lower than the reference concentration, and producing a processing liquid having a concentration lower than the reference concentration by the new liquid supply device to supply the produced processing liquid to the third tank when the concentration detected by the first concentration meter is higher than the reference concentration, and
   the second new liquid supply operation includes producing a processing liquid having a concentration higher than the reference concentration by the new liquid supply device to supply the produced processing liquid to the second tank when the concentration detected by the second concentration meter is lower than the reference concentration, and producing a processing liquid having a concentration lower than the reference concentration by the new liquid supply device to supply the produced processing liquid to the second tank when the concentration detected by the second concentration meter is higher than the reference concentration.

5. The substrate processing method according to claim 1, wherein
   the substrate includes a first film formed of a first material, and a second film formed of a second material,
   the processing liquid includes a component that selectively etches the first material at a higher rate than the second material, and
   the adjustment operation by the second tank and the adjustment operation by the third tank each include an operation of adjusting concentration of the component in the processing liquid.

6. The substrate processing method according to claim 5, wherein
   the first material includes silicon nitride, and the second material includes silicon oxide,
   the processing liquid includes silicon and a phosphoric acid aqueous solution, and
   the adjustment operation by the second tank and the adjustment operation by the third tank each include adjusting the concentration of the component in the processing liquid.

7. The substrate processing method according to claim 6, wherein
   the adjustment operation by the second tank and the adjustment operation by the third tank each include adjusting at least one of concentration of the phosphoric acid aqueous solution and concentration of the silicon in the processing liquid.

8. The substrate processing method according to claim 6, wherein
the adjustment operation by the third tank includes a first new liquid addition operation of adding new silicon and a new phosphoric acid aqueous solution from a new liquid supply device to the third tank, and
the adjustment operation by the second tank includes a second new liquid addition operation of adding the new silicon and the new phosphoric acid aqueous solution from the new liquid supply device to the second tank.

9. The substrate processing method according to claim 8, further comprising producing the new processing liquid by mixing a silicon liquid concentrate and a phosphoric acid aqueous solution at a predetermined ratio in the new liquid supply device.

10. The substrate processing method according to claim 9, wherein
the producing the new processing liquid includes changing a mixing ratio based on the concentration of the processing liquid in the third tank in the first new liquid addition operation, and changing a mixing ratio based on the concentration of the processing liquid in the second tank in the second new liquid addition operation.

11. A substrate processing method using a substrate processing apparatus, wherein
the substrate processing apparatus includes
a processing unit that includes a processing liquid nozzle that supplies a processing liquid to a substrate, and
a plurality of tanks that include a supply tank, an adjustment tank and a collection tank,
the substrate processing method comprising
performing in parallel a supply operation for supplying the processing liquid from the supply tank to the processing liquid nozzle, a collection operation for collecting the processing liquid from the processing unit to the collection tank, and an adjustment operation for adjusting concentration of the processing liquid stored in the adjustment tank,
the performing in parallel the supply operation, the collection operation and the adjustment operation including:
changing a path of the processing liquid such that the collection tank is changed to the adjustment tank after the collection operation is finished;
changing the path of the processing liquid such that the adjustment tank is changed to the supply tank and the adjusted processing liquid is supplied to the processing unit after the adjustment operation is finished; and
changing the path of the processing liquid such that the supply tank is changed to the collection tank after the supply operation is finished,
wherein the plurality of tanks include first, second and third tanks,
any one of the first, second and third tanks is set as the supply tank,
another one of the first, second and third tanks is set as the collection tank,
yet another one of the first, second and third tanks is set as the adjustment tank,
the supply operation is performed by supplying the processing liquid to the processing liquid nozzle from the first, second or third tank set as the supply tank,
the collection operation is performed by collecting the processing liquid from the processing unit selectively to the first, second or third tank set as the collection tank, and
the adjustment operation is performed by adjusting concentration of the processing liquid stored in the first, second or third tank set as the adjustment tank, and
the performing in parallel the supply operation, the collection operation and the adjustment operation further includes:
sequentially performing the supply operation from the first tank to the processing liquid nozzle, the supply operation from the third tank to the processing liquid nozzle, and the supply operation from the second tank to the processing liquid nozzle;
sequentially performing the collection operation from the processing unit to the second tank, the collection operation from the processing unit to the first tank, and the collection operation from the processing unit to the third tank; and
sequentially performing the adjustment operation in the third tank, the adjustment operation in the second tank, and the adjustment operation in the first tank.

12. A substrate processing method using a substrate processing apparatus, wherein
the substrate processing apparatus includes
a processing liquid nozzle that supplies a processing liquid to a substrate, and
a plurality of tanks that include a supply tank, an adjustment tank and a collection tank, and
the substrate processing method includes the steps of:
concurrently performing a supply operation for supplying the processing liquid from the supply tank to the processing liquid nozzle, a collection operation for collecting the processing liquid from the processing unit to the collection tank, and an adjustment operation for adjusting concentration of the processing liquid stored in the adjustment tank;
changing the collection tank to the adjustment tank after the collection operation is finished; and
changing a path of the processing liquid such that the adjusted processing liquid is supplied to the processing unit after the adjustment operation is finished.

* * * * *